United States Patent
Chiang et al.

(10) Patent No.: US 11,961,900 B2
(45) Date of Patent: *Apr. 16, 2024

(54) INTEGRATED CIRCUIT WITH A FIN AND GATE STRUCTURE AND METHOD MAKING THE SAME

(71) Applicant: Taiwan Semiconductor Manufacturing Co., Ltd., Hsin-Chu (TW)

(72) Inventors: Kuo-Cheng Chiang, Hsinchu County (TW); Teng-Chun Tsai, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 109 days.

This patent is subject to a terminal disclaimer.

(21) Appl. No.: 17/328,389

(22) Filed: May 24, 2021

(65) Prior Publication Data

US 2021/0288161 A1 Sep. 16, 2021

Related U.S. Application Data

(63) Continuation of application No. 16/730,192, filed on Dec. 30, 2019, now Pat. No. 11,018,246, which is a
(Continued)

(51) Int. Cl.
*H01L 29/66* (2006.01)
*H01L 21/762* (2006.01)
(Continued)

(52) U.S. Cl.
CPC .... *H01L 29/6681* (2013.01); *H01L 21/76229* (2013.01); *H01L 21/823431* (2013.01);
(Continued)

(58) Field of Classification Search
CPC .......... H01L 29/6681; H01L 29/66818; H01L 29/66545; H01L 29/6656; H01L 29/161;
(Continued)

(56) References Cited

U.S. PATENT DOCUMENTS 10,529,833 B2 * 1/2020 Ching .................. H01L 27/0924
2007/0292996 A1 * 12/2007 Abadeer ............ G01R 31/2831
257/E21.535
(Continued)

FOREIGN PATENT DOCUMENTS

CN 107004710 A 8/2017

*Primary Examiner* — Michael Carter
*Assistant Examiner* — Lawrence C Tynes, Jr.
(74) *Attorney, Agent, or Firm* — Haynes and Boone, LLP

(57) ABSTRACT

The present disclosure provides a semiconductor structure. The semiconductor structure includes device fins formed on a substrate; fill fins formed on the substrate and disposed among the device fins; and gate stacks formed on the device fins and the fill fins. The fill fins include a first dielectric material layer and a second dielectric material layer deposited on the first dielectric material layer. The first and second dielectric material layers are different from each other in composition.

20 Claims, 29 Drawing Sheets

Related U.S. Application Data continuation of application No. 15/864,525, filed on Jan. 8, 2018, now Pat. No. 10,529,833.

(60) Provisional application No. 62/551,044, filed on Aug. 28, 2017.

(51) Int. Cl.
*H01L 21/8234* (2006.01)
*H01L 21/8238* (2006.01)
*H01L 27/088* (2006.01)
*H01L 27/092* (2006.01)
*H01L 29/161* (2006.01)
*H01L 29/165* (2006.01)
*H01L 29/78* (2006.01)

(52) U.S. Cl.
CPC ............... *H01L 21/823437* (2013.01); *H01L 21/823481* (2013.01); *H01L 21/823821* (2013.01); *H01L 27/0886* (2013.01); *H01L 27/0924* (2013.01); *H01L 29/161* (2013.01); *H01L 29/66545* (2013.01); *H01L 29/6656* (2013.01); *H01L 29/165* (2013.01); *H01L 29/7848* (2013.01); *H01L 2029/7858* (2013.01)

(58) Field of Classification Search
CPC ......... H01L 2029/7858; H01L 27/0924; H01L 27/0886; H01L 21/823481; H01L 21/823437; H01L 21/823431
See application file for complete search history.

(56) References Cited

U.S. PATENT DOCUMENTS

| | | | |
|---|---|---|---|
| 2014/0145247 A1* | 5/2014 | Cheng | H01L 27/0886 438/424 |
| 2015/0064874 A1* | 3/2015 | Cheng | H01L 21/02227 438/423 |
| 2016/0336237 A1 | 11/2016 | Lee et al. | |
| 2017/0338323 A1* | 11/2017 | Cheng | H01L 29/161 |
| 2019/0006486 A1* | 1/2019 | Ching | H01L 29/0653 |

* cited by examiner

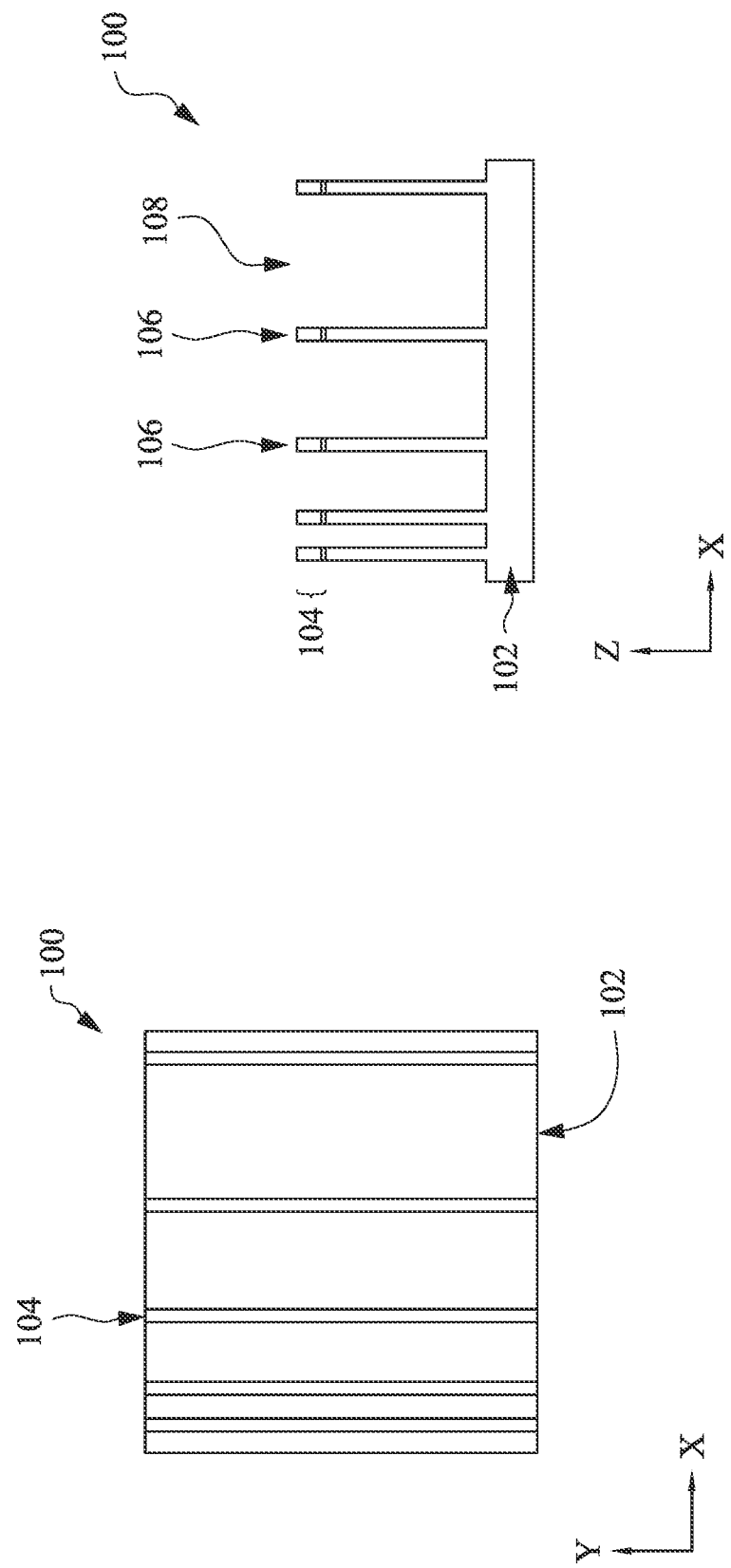

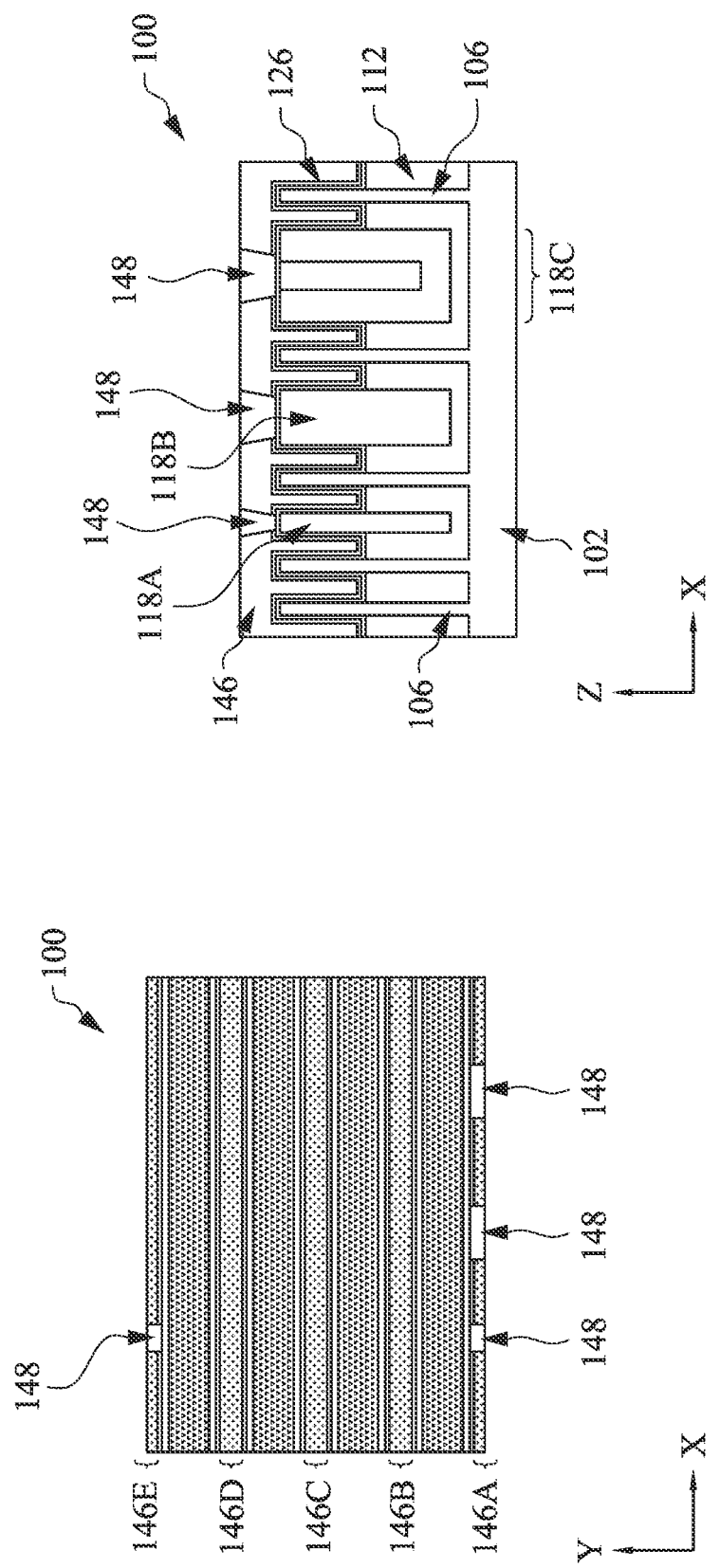

INTEGRATED CIRCUIT WITH A FIN AND GATE STRUCTURE AND METHOD MAKING THE SAME

PRIORITY

This application is a continuation of U.S. patent application Ser. No. 16/730,192, filed Dec. 30, 2019, which is a continuation of U.S. patent application Ser. No. 15/864,525, filed Jan. 8, 2018, which further claims the benefit of U.S. Provisional Application 62/551,044 entitled "Integrated Circuit With A Gate Structure and Method Making The Same," filed Aug. 28, 2017, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, a three-dimensional transistor, such as a fin-like field-effect transistor (FinFET), has been introduced to replace a planar transistor. A FinFET can be thought of as a typical planar device extruded into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, because of the complexity inherent in FinFETs and other nonplanar devices, and further because of the high pattern density in the advanced technology modes, a number of techniques used in manufacturing planar transistors are not well suited to fabricating nonplanar devices. As merely one example, conventional techniques for forming gate stacks on a semiconductor substrate may produce undesirable collapse or sticking issue. In the advanced technology nodes, the height of the transistor gates needs to be very higher. For example, when the gate length is less than 20 nm, the gate aspect ratio, defined as the gate height over the gate width, can be greater than 15. The high gate aspect ratio may cause adjacent gates to collapse or stick together, especially during various processes, such as wet etching and cleaning. Other concerns includes under-cutting to shallow trench isolation (STI) during source/drain epitaxy growth or over-etching to the STI during forming contacts to source and drain in various examples.

Therefore, while existing fabrication techniques have been generally adequate for planar devices, in order to continue to meet ever-increasing design requirements, further advances are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4B, 5B, 6B, 7B, 8B, 9B, 10B, 11B, 12B, 13B, 15B, and 16B are top views of the semiconductor structure at various fabrication stages, constructed in accordance with some embodiments.

FIGS. 4C, 5C, 6C, 7C, 8C, 9C, 10C, 11C, 12C, 13C, 15C, and 16C are sectional views of the semiconductor structure at various fabrication stages, constructed in accordance with some embodiments.

DETAILED DESCRIPTION

Figure 1A:
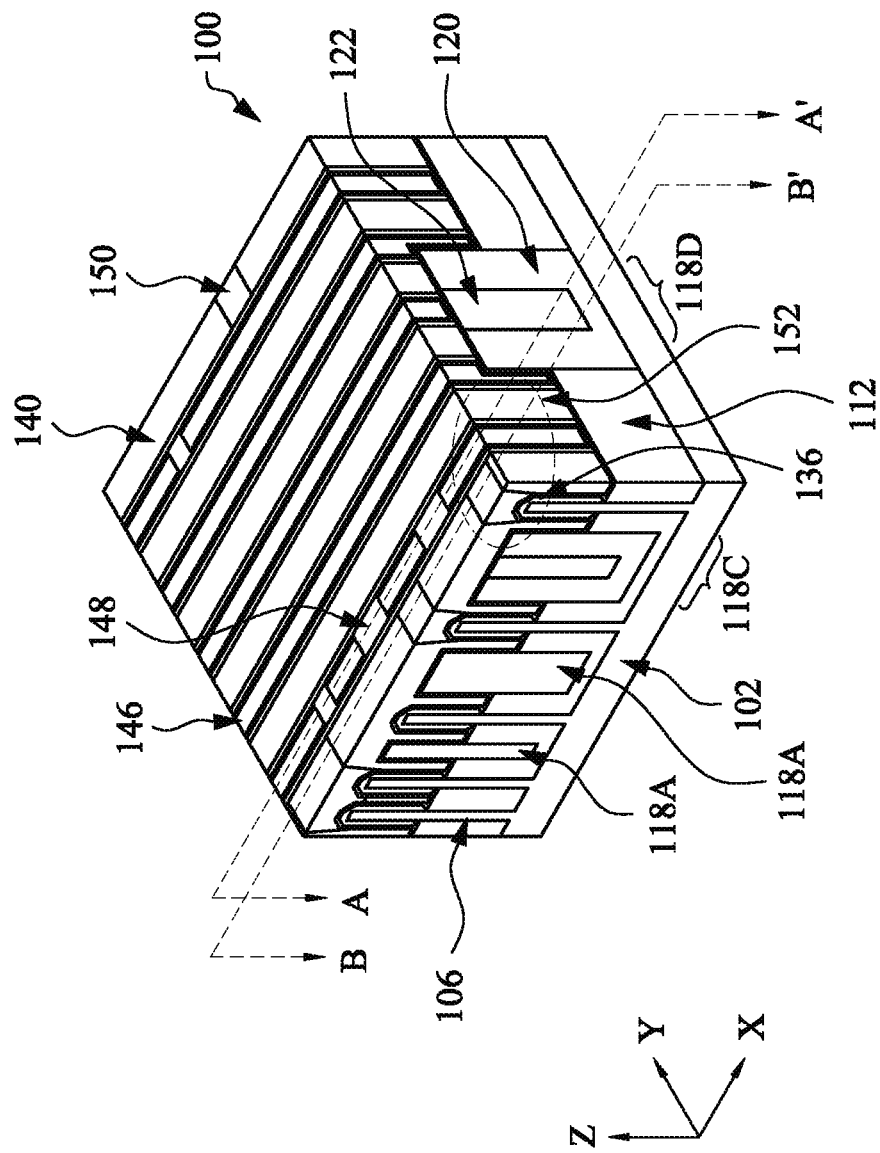
FIG. 1A is a perspective view of a semiconductor structure, constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 1C:
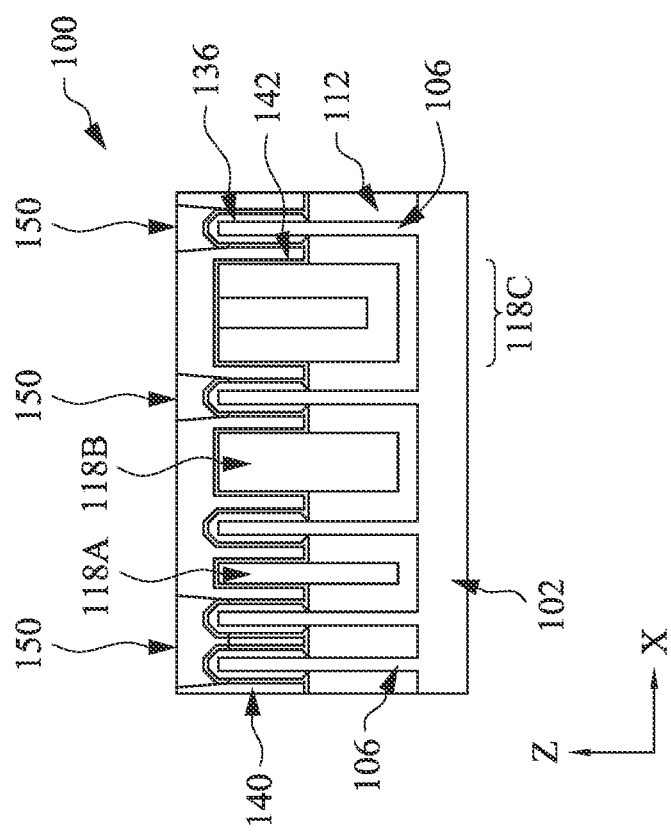
FIG. 1C is a sectional view of the semiconductor structure of FIG. 1A along the dashed line BB', constructed in accordance with some embodiments.
Figure 1B:
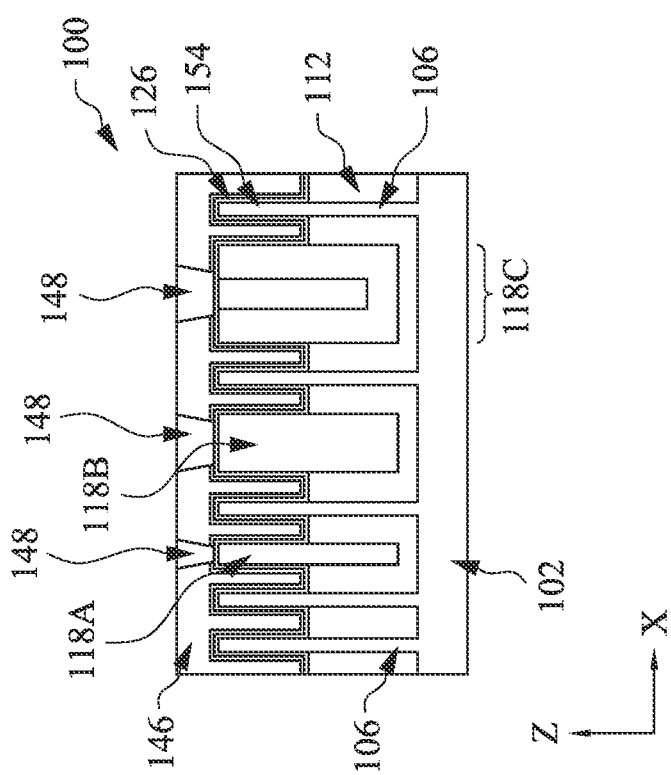
FIG. 1B is a sectional view of the semiconductor structure of FIG. 1A along the dashed line AA', constructed in accordance with some embodiments.

FIG. 1A is a perspective view of a portion of a workpiece 100 according to various aspects of the present disclosure. FIGS. 1B and 1C are sectional views of the workpiece 100 along the dashed lines AA' and BB', respectively, constructed according to various aspects of the present disclosure. FIGS. 1A-1C have been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate 102 also includes various isolation features, such as shallow trench isolation (STI) features 112 and active regions 106 defined by the STI features 112.

In some embodiments, the active regions are extended above the isolation features 112 with non-planar structure, such as a fin structure 106. The fin structure has one or more raised active regions (or fin active regions) separated by the STI features. Those fin active regions are also referred to as device fins 106, to be differentiated from the fill fins introduced later. The fin structure 106 is also referred to as device fin structure. While the illustrated embodiments include a fin structure, further embodiments include other raised active and passive devices formed upon the substrate 102.

The workpiece 100 includes FETs, such as n-channel field effect transistor (nFET) and a p-channel field effect transistor (pFET). In some one example that the active regions are defined in the fin structure, the workpiece 100 includes FinFETs, such as exemplary an n-channel FinFET and a p-channel FinFET.

In the present embodiment, the workpiece 100 includes various FETs 152 designed for various functions, such as core devices, memory devices, and input/output (I/O) devices accordingly. Those devices and the formation will be described through the detailed description. One FET is illustrated by a dashed circle to include various features of the FET. In turn, each of FETs 152 includes a pair of opposing source/drain features (or source/drain regions) 136, which may include various doped semiconductor materials, a gate stack 146, and a channel region 154 (as a portion of the active region) disposed between the source/drain features and underlying the gate stack. The flow of carriers (electrons for the n-channel device and holes for the p-channel device) through the channel region 154 is controlled by a voltage applied to a gate stack 146 adjacent to the channel region (and overwrapping the channel region when the active regions are defined in a fin structure).

In some embodiments, the active regions are defined in the fin structure 106, the channel region 154 rises above the STI features 112. The raised channel region 154 provides a larger surface area proximate to the gate stack 146 than comparable planar devices. This strengthens the electromagnetic field interactions between the gate stack 146 and the channel region 154, which may 4reduce threshold voltage, leakage and short channel effects associated with smaller devices. Thus in many embodiments, FinFETS and other nonplanar devices deliver better performance in a smaller footprint than their planar counterparts.

In the present example, the device fins 106 have elongated shape oriented in the Y direction and the gate stacks 146 have elongated shape oriented in the X direction. The X and Y directions are orthogonal from each other. The workpiece 100 further includes fill fins 118, or collectively a fill fin structure. The fill fins 118 extruded above the isolation regions 112 but are dielectric features filling between the device fins 106. The fill fins 118 have various dimensions and orientations. For example, the fill fins 118 include fill fins 118A, 118B and 118C oriented in the Y direction with different widths. Those fill fins tune overall fin pattern density, reinforce the mechanical strength of the device fins, and enhance the manufacturing capability. The fill fins 118 also include fill fin 118D oriented in the X direction and serves as gate cut feature, so to improve the quality of the gate patterning through this double patterning technique. The fill fins 118 include dual dielectric material layers 120 and 122. In the present embodiments, the first fill dielectric material layer 120 is deposited by atomic layer deposition (ALD) and the second fill dielectric material layer 122 is deposited by spin-on coating or flowable chemical vapor deposition (FCVD). The first and second dielectric materials have different compositions. For examples, the first fill dielectric material layer 120 is a high-k dielectric material, such as hafnium oxide ($H_fO_2$), or zirconium oxide ($Z_rO_2$) while the second fill dielectric material layer 122 includes carbon-containing dielectric material, such as silicon carbon oxide, silicon carbon oxynitride or silicon carbon nitride. For those fill fins with smaller widths, such as fill fins 118A and 118B, only the first dielectric material layer 120 presents. For those fill fins with greater widths, such as fill fins 118C and 118BD, both the first fill dielectric material layer 120 and the second fill dielectric material layer 122 present. By using the dual dielectric material layers to form the fill fins 118, the processing capability is increased. Especially, after the first fill dielectric material layer 120, the aspect ratios of the trenches are reduced to be easily filled by the second dielectric material layer 122, thus the processing window is enhance, which will be further explained later. The workpiece 100 may include other features and structures, such as contact features 150 to the source/drain features 136 and the metal gate cut features 148. Those features and the method to form the same are further described through the following descriptions.

In some embodiments, the structure and the method of the present disclosure may provide the channel regions 154 that is un-doped and has higher carrier mobility and further enhanced device performance, such as increased device speed. In some other embodiments, the channel region 154 may be alternatively doped with proper types of dopants.

Figure 2:
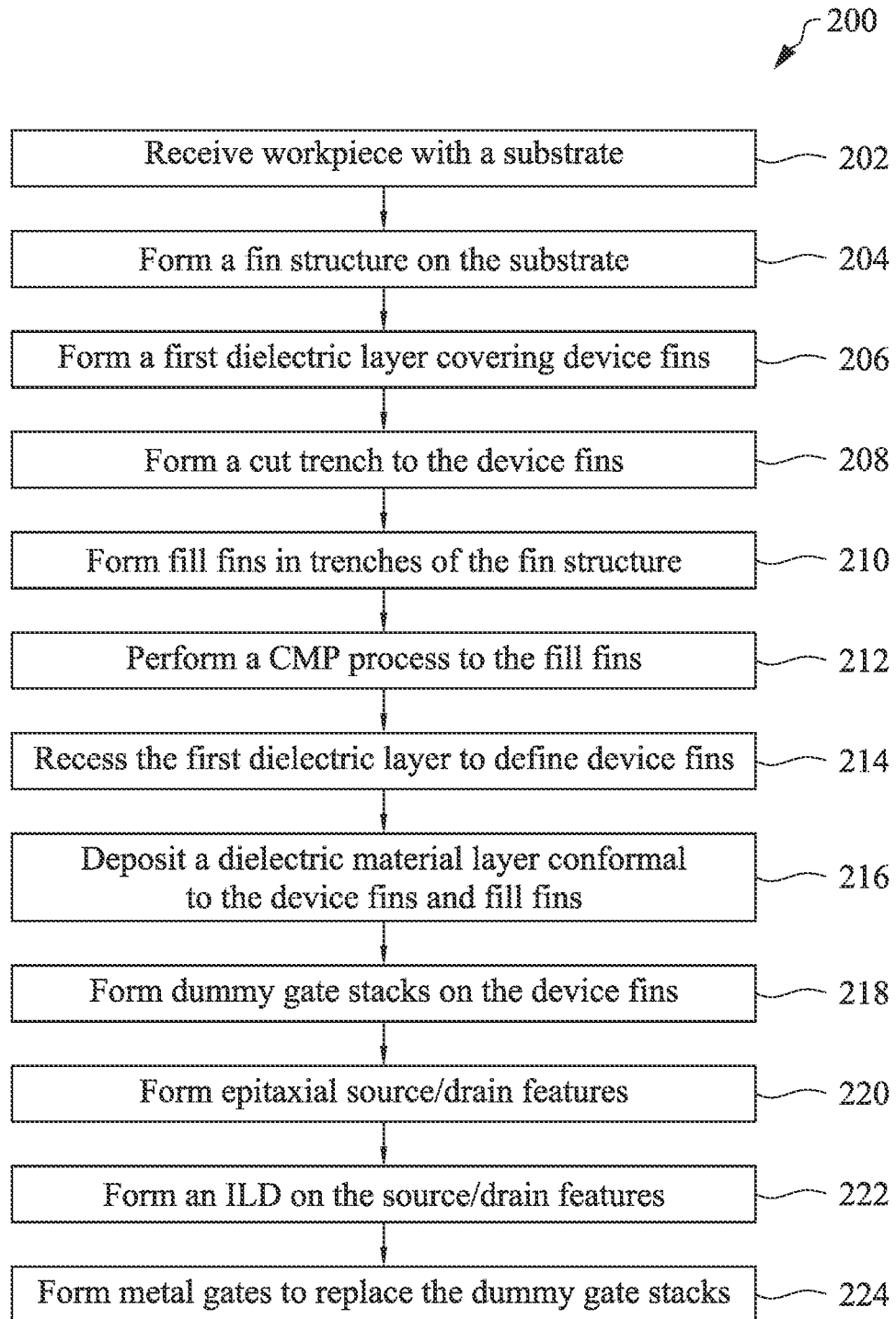
FIG. 2 is a flowchart of an integrated circuit fabrication method in accordance with some embodiments.

Exemplary methods of forming the workpiece 100 having FET devices will now be described with reference to FIGS. 2-16C. FIG. 2 is a flowchart of a method 200 for fabricating FET devices on a workpiece 100 according to various aspects of the present disclosure. The figures that follow refer perspective views of the workpiece 100, top views, and/or cross-sections taken through the gate stacks 146 (e.g., along the dashed line AA' of FIG. 1A) or through the source/drain regions 136 (e.g., along the dashed line BB' of FIG. 1A) of the workpiece 100.

The method 200 and the structure of the workpiece 100 are collectively described according to various aspects of the present disclosure. It is understood that additional steps can be provided before, during, and after the method 200 and that some of the steps described can be replaced or eliminated for other embodiments of the method. In the following description, the active regions are also collectively referred to as fin structure 106. However, active regions are not limited to fin active regions in the fin structure.

Figure 3:
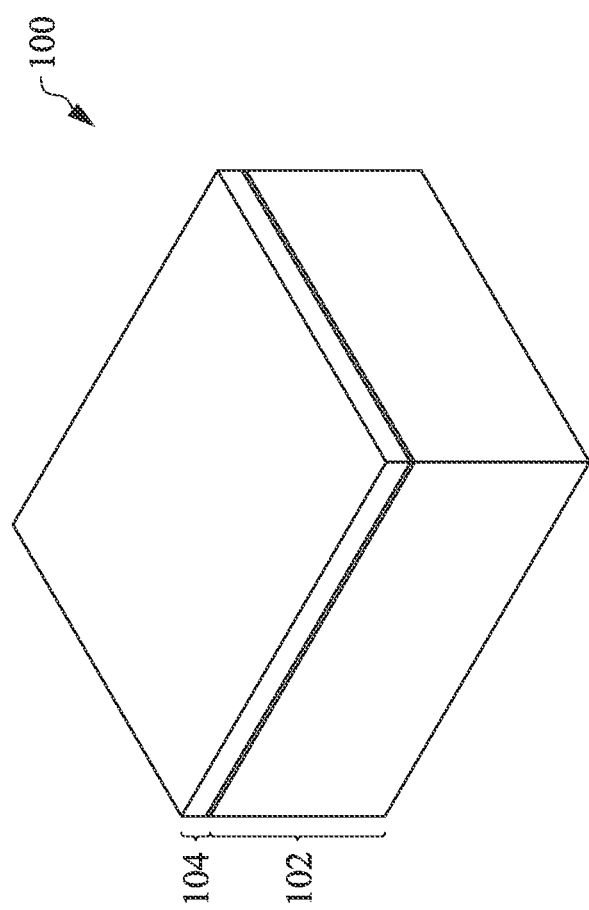
FIG. 3 is a perspective view of a semiconductor structure, constructed in accordance with some embodiments.

Referring first to block 202 of FIG. 2 and to FIG. 3, a workpiece 100 is received, which includes a substrate 102, such as a silicon substrate. The substrate 102 may alternatively or additionally include includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); or combinations thereof.

The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 102. In some such examples, the substrate 102 may include an embedded insulating layer such as a silicon oxide, a silicon nitride, a silicon oxynitride, or other suitable insulating materials.

The received workpiece 100 may have one or more layers formed upon it. For example, the substrate 102 includes one or more semiconductor layer epitaxially grown on bulk silicon, such as a silicon wafer. For example, the substrate 102 includes a first semiconductor layer formed on bulk silicon and a second semiconductor layer formed on the first semiconductor layer. The first semiconductor layer includes a first semiconductor material (such as SiGe) and the second semiconductor layer includes a second semiconductor material (such as Si) different from the first semiconductor material. The first and second semiconductor layers are epitaxially grown by suitable techniques, such as selective epitaxy growth (SEG). In some embodiments, suitable deposition processes for epitaxy growth include ALD, chemical vapor deposition (CVD), high-density plasma CVD (HDP-CVD), physical vapor deposition (PVD) and/or other suitable deposition processes. Any of these techniques may be used to grow the semiconductor layer having any composition including a graded composition.

Various doping process may be applied to the substrate 102 through a proper method, such as ion implantation. In the present embodiment, an anti-punch-through (APT) process is applied to the substrate 102 to introduce proper dopants to respective regions of the substrate through ion implantations. The APT process may include forming a hard mask with openings defining regions for nFETs; performing an ion implantation to the nFET regions; and removing the hard mask, and similar steps for pFETs.

To facilitate fabrication and to avoid damage to the semiconductor layer, one or more hard mask layer 104 may be formed on the substrate 102. For example, the hard mask layer 104 includes a dielectric such as semiconductor oxide, semiconductor nitride, semiconductor oxynitride, or semiconductor carbide. In some examples, the hard mask layer 104 includes two or more films stacked together, such as a silicon oxide film and a silicon nitride film in stack. The hard mask layer 104 may be formed by thermal growth, ALD, CVD, HDP-CVD, PVD, and/or other suitable deposition processes. The hard mask may include other suitable material, such as a silicon oxide layer and a poly-silicon layer on the silicon oxide layer.

Figure 4A:
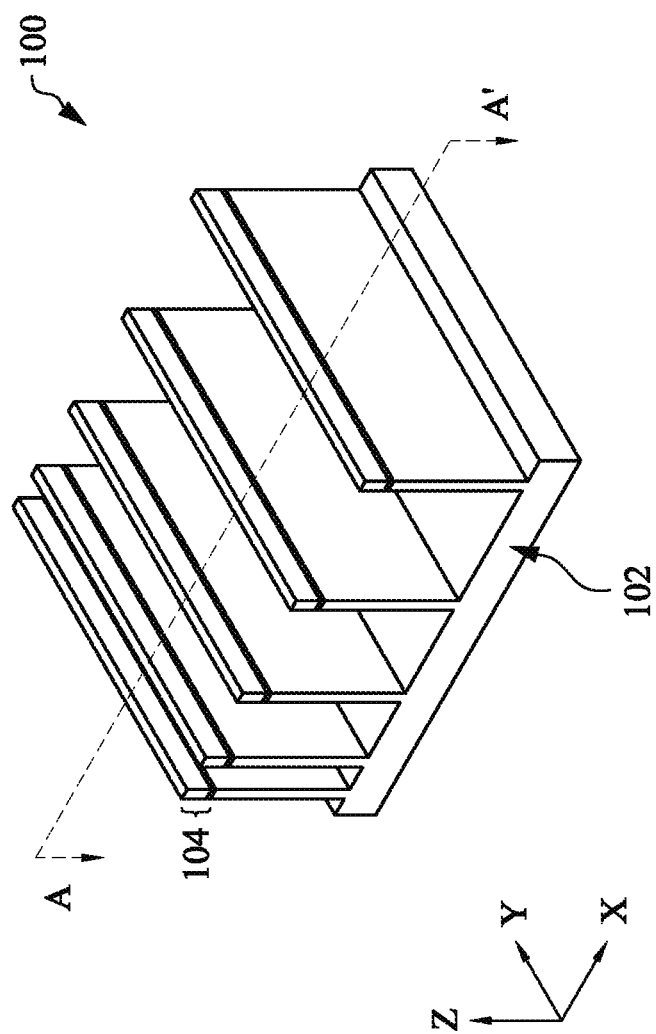
FIGS. 4A, 5A, 6A, 7A, 8A, 9A, 10A, 11A, 12A, 13A, 15A, and 16A are perspective views of the semiconductor structure at various fabrication stages, constructed in accordance with some embodiments.

Referring to an operation 204 of FIG. 2 and FIGS. 4A-4C, the method 200 patterns the substrate 102 to form one or more device fins 106 extending from the substrate 102. FIG. 4A is a schematic view of the workpiece 100; FIG. 4B is a top view of the workpiece 100; and FIG. 4C is a sectional view of the workpiece 100 along the dashed line AA'. In some embodiments, the operation 204 includes lithography process and etching. In furtherance of the embodiments, the operation 204 includes forming a patterned photoresist (or resist) layer by a lithography process and etching to form trenches and a fin structure using the patterned resist layer as an etch mask. In the present embodiment, the openings in the patterned resist layer are first transferred to the hard mask 104 by a first etching and then are transferred to the substrate 102 by a second etching. More details of the operation 204 are further provided below.

A resist used to define the fin structure 106 may be formed on the hard mask layer 104. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning or lithography process.

In one embodiment, the resist layer is patterned to leave the portions of the photoresist material disposed over the workpiece 100 by the lithography process. After patterning the resist, an etching process is performed on the workpiece 100 to open the hard mask layer 104, thereby transferring the pattern from the resist layer to the hard mask layer 104. The remaining resist layer may be removed after the patterning the hard mask layer 104. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The first etching process applied to the hard mask 104 may include multiple etching steps. For example, the silicon oxide film in the hard mask layer may be etched by a diluted hydrofluorine solution and the silicon nitride film in the hard mask layer may be etched by a phosphoric acid solution. The second etching process applied to the substrate 102 may include any suitable etching technique such as dry etching, wet etching, other etching methods (e.g., reactive ion etching (RIE)), or a combination thereof. In some examples, the second etching process may include multiple etching steps with different etching chemistries, each targeting a particular material of the workpiece 100. In some examples, the semiconductor material of the substrate may be etched by a dry etching process using a fluorine-based etchant. In some embodiments, etching includes multiple etching steps with different etching chemistries, each targeting a particular material of the substrate 102 and each selected to resist etching the hard mask 104. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the semiconductor layers become the device fins 106, defining the trenches 108 between the device fins 106, such as the trenches 108A~108D in the illustrated embodiment.

The etching processes are designed to produce fin structure 106 of any suitable height and width extending from the substrate 102. Particularly, the etching process applied to the substrate 102 is controlled such that the substrate 102 is partially etched, as illustrated in FIG. 4A. This may be achieved by controlling etching time or by controlling other etching parameter(s). By the etching processes, the fin structure is formed and extended from the substrate 102. The fin structure 106 includes a plurality of elongated fin-like active regions (simply fins) oriented in the Y direction. In addition to defining the fin structure 106, the etching process also define one or more isolation trench 108 between the active regions of the fin structure 106. The fin active regions of the fin structure 106 are also referred to as device fins, to differentiate from fill fins to be introduced later. As illustrated from the above description, the device fins 106 include one or more semiconductor material same or different form that of the substrate 102. For example, the device fins 106 include silicon, germanium, silicon germanium, or other suitable semiconductor material. In some other examples, the device fins 106 include silicon germanium with graded concentration, such as the germanium concentration increasing toward the top surface of the device fins.

Figure 5A:
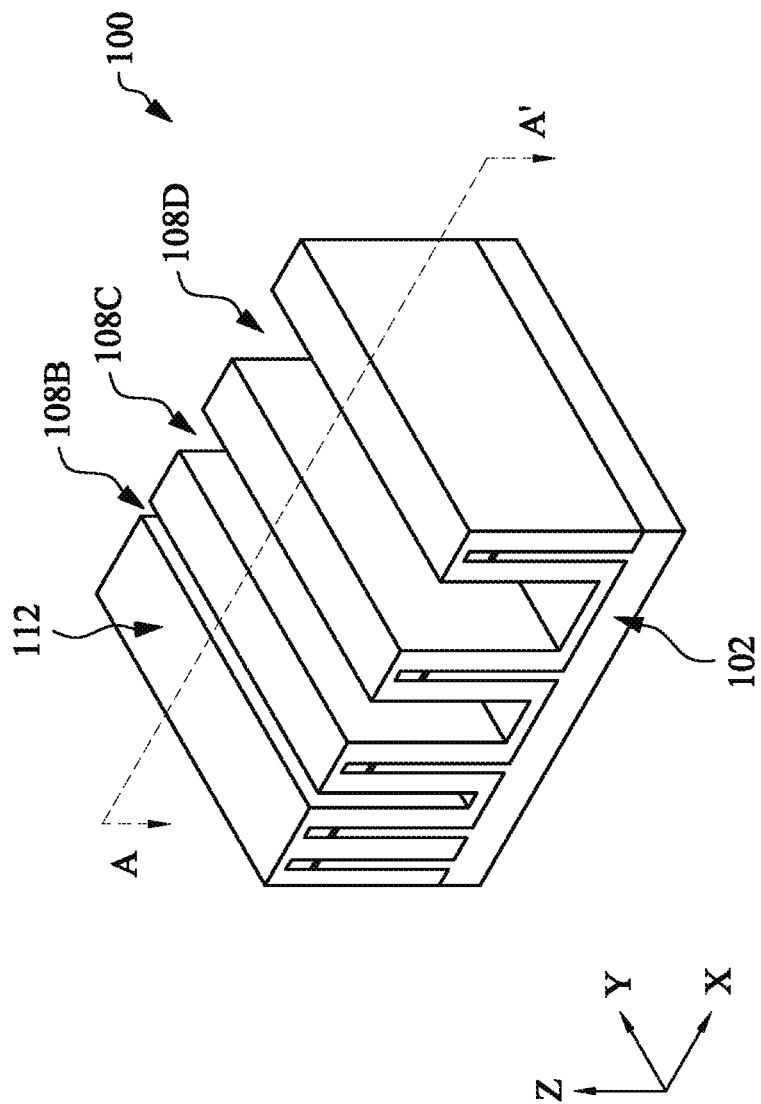
Figure 5C:
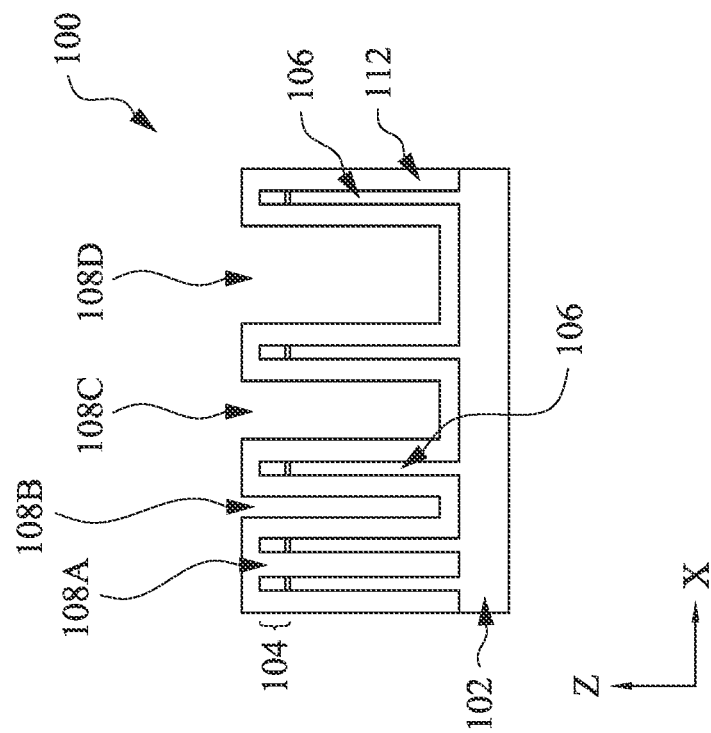
Figure 5B:
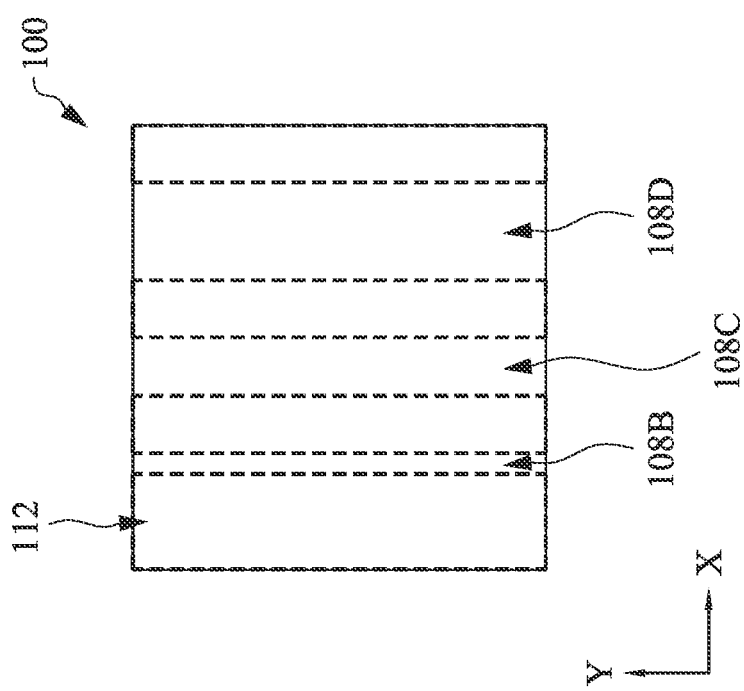

Referring to FIG. 2 and FIGS. 5A-5C, the method 200 proceeds to an operation 206 to form a first dielectric layer 112 on the substrate 102. FIG. 5A is a schematic view of the workpiece 100; FIG. 5B is a top view of the workpiece 100; and FIG. 5C is a sectional view of the workpiece 100 along the dashed line AA'. In the present embodiment, the dielectric layer 112 is deposited on the substrate 102 with a conformal profile, covering the fin structure 106. The dielectric layer 112 may include a single dielectric material layer or multiple dielectric material layers. Suitable dielectric materials for the dielectric layer 112 include silicon oxides, silicon nitrides, silicon carbides, fluoro-silicate glass (FSG), low-K dielectric materials, other suitable dielectric materials, or a combination thereof. The dielectric material may be deposited by any suitable technique including thermal growth, CVD, HDP-CVD, PVD, ALD, and/or spin-on techniques. In the illustrated embodiment, an ALD process is used as conformal deposition technique.

The dielectric layer 112 constitutes, at least partially, an isolation feature, such as a shallow trench isolation feature (STI). The isolation feature may include multiple layers, such as the dielectric layer 112 depicted in FIG. 5A as one of the multiple layers.

As will be shown below at later stage, fill fins will be formed in some of these trenches. In contrast, some trenches between device fins 106 with relatively narrow spacing (e.g., <2 nm) may be filled up by the dielectric layer 112, such as the trench 108A, and thus no fill fin is formed in this trench. Some trenches may have a reduced width substantially same to a width of the device fin 106, such as the trench 108B. Some trenches between device fins 106 with relatively wide spacing may still have large gap, such as the trench 108C or 108D.

Figure 6A:
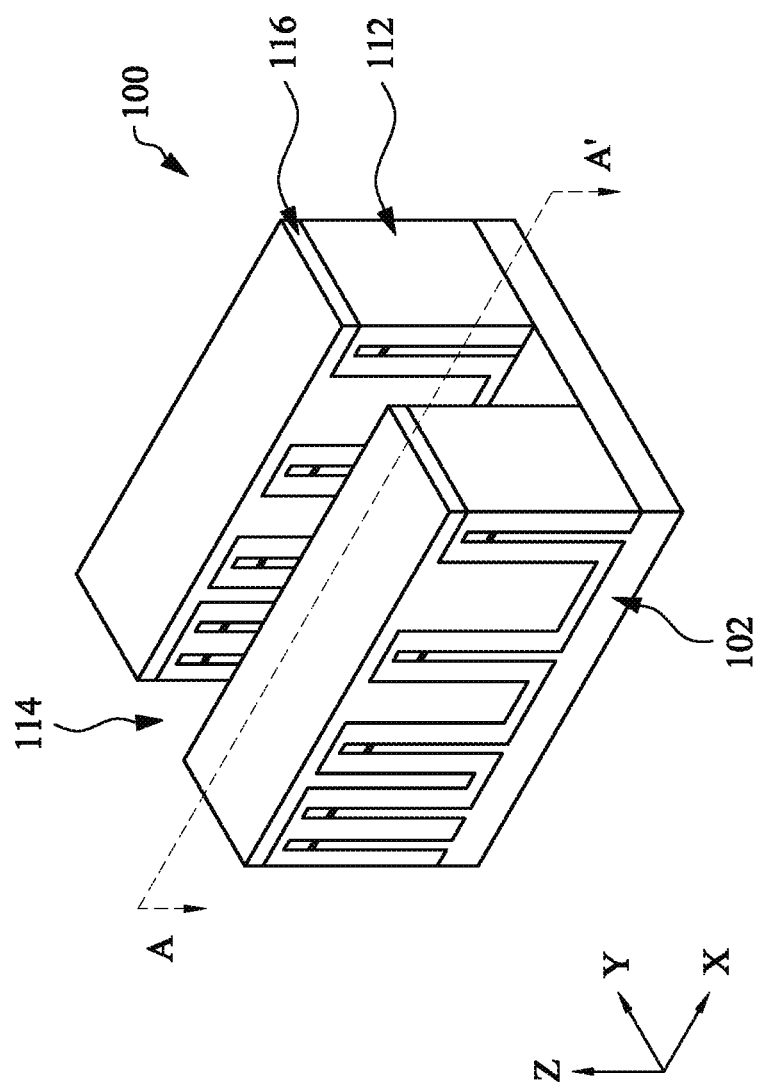
Figure 6C:
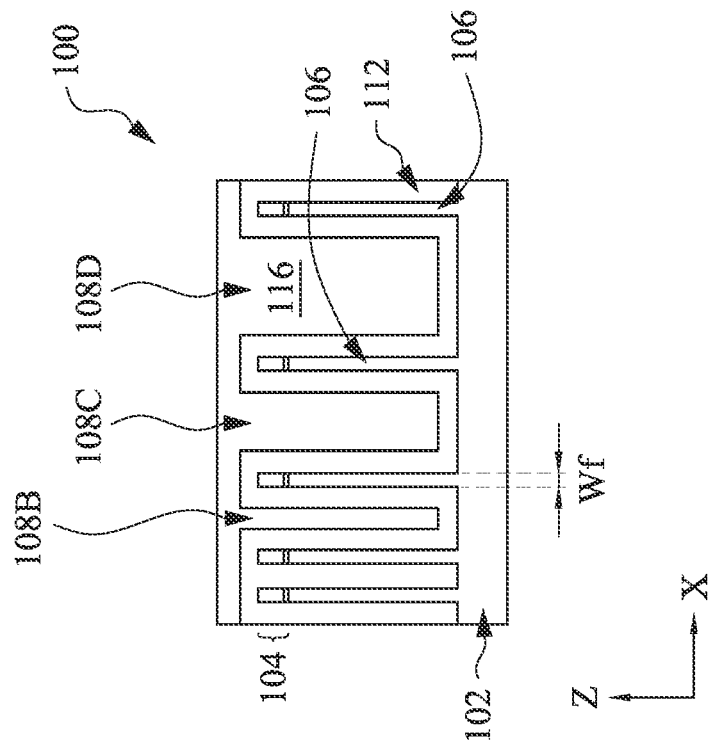
Figure 6B:
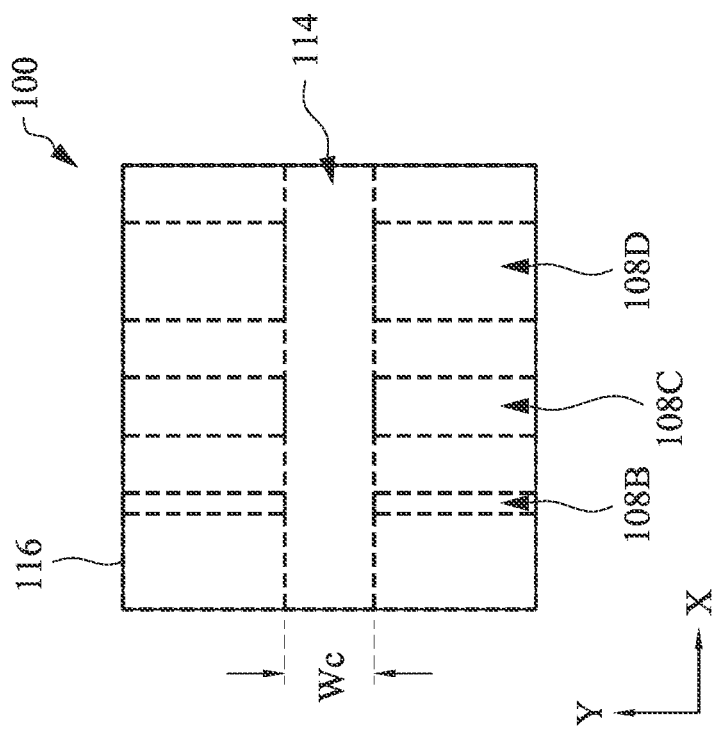

Referring to FIG. 2 and FIGS. 6A-6C, the method 200 proceeds to an operation 208 to form a course cut (or cut trench) 114 to the devices fins 106 by lithography patterning and etching. FIG. 6A is a schematic view of the workpiece 100; FIG. 6B is a top view of the workpiece 100; and FIG. 6C is a sectional view of the workpiece 100 along the dashed line AA'. The cut trench 114 is a trench cut through the device fins 106, defining ends of the device fins 106. The cut trench 114 extends through multiple device fins 106 along the X direction. The lithography patterning and etching in the operation 208 is similar to those implemented in the operation 204. Particularly, the patterned resist layer 116 is formed by a lithography patterning process, and an etching process is applied to the device fins 106 and the dielectric layer 112 to form the cut trench 114. The cut trench 114 has a width Wc substantially greater than the width Wf of the device fins 106. In some embodiments, the ratio Wc/Wf is greater than 2, such as ranging from 3 to 4. After the formation of the cut trench 114, the resist layer 116 is removed by wet stripping or plasma ashing.

Figure 7A:
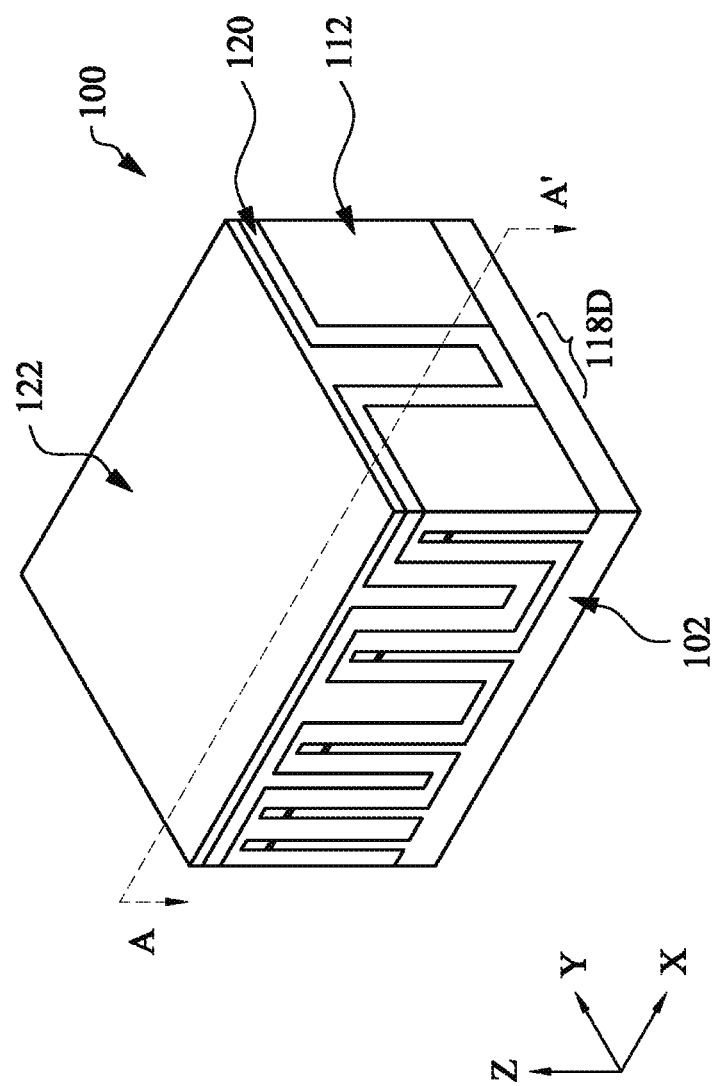
Figure 7C:
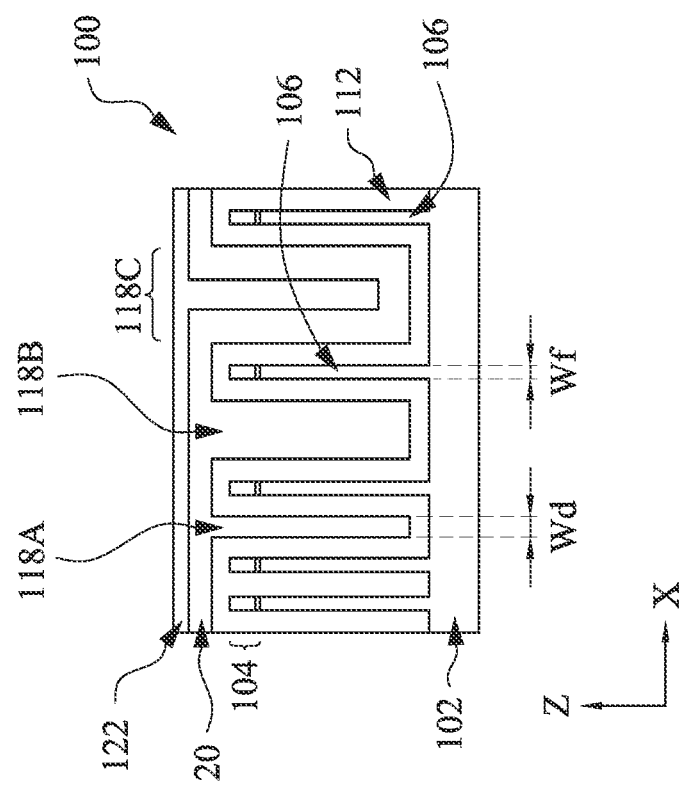
Figure 7B:
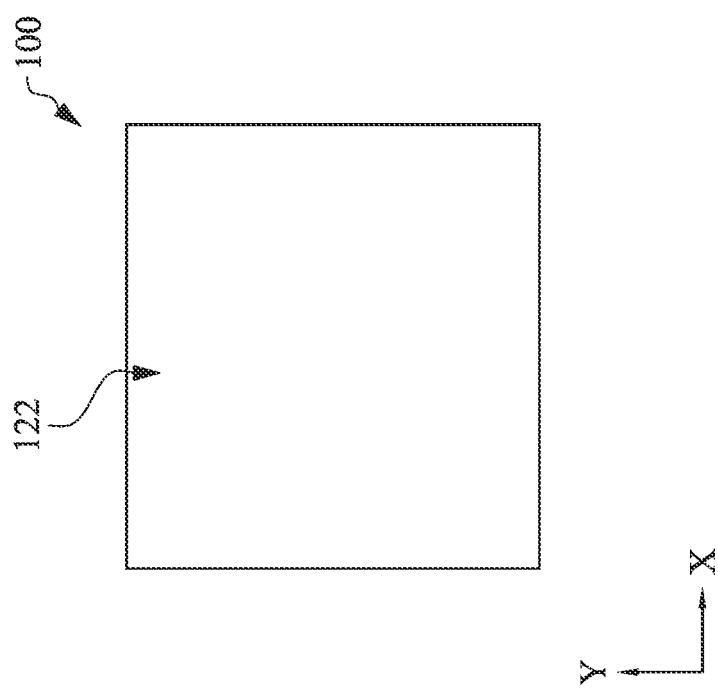

Referring to FIG. 2 and FIGS. 7A-7C, the method 200 proceeds to an operation 210 to fill the trenches of the device fins, thereby forming fill fins 118 (such as fill fins 118A-118C) on the substrate 102. FIG. 7A is a schematic view of the workpiece 100; FIG. 7B is a top view of the workpiece 100; and FIG. 7C is a sectional view of the workpiece 100 along the dashed line AA'. The fill fins 118 are dielectric features extended vertically on the substrate 102. The fill fins 118 do not function as active regions but for other purposes, such as tuning patterning density for better fabrication, therefore are referred differently from the device fins. The fill fins 118 are deposited in the trenches 108, such as the fill fin 118A in the trench 108B; the fill fin 118B in the trench 108C; and the fill fin 118C in the trench 108D. The fill fins 118 include multiple dielectric material layers. In the present embodiment, the fill fins 118 include a first fill dielectric layer 120 and a second fill dielectric layer 122. In the furtherance of the embodiment, the first fill dielectric layer 120 is deposited by ALD, and the second fill dielectric layer 122 is deposited by flowable CVD (FCVD) or alternatively by spin-on coating. As noted above, the trenches 108 have varying width. Some trenches (such as trenches 108B and 108C) have smaller dimensions (e.g., less than 40 nm) and are completely filled by the first fill dielectric layer 120. Some trenches (such as trench 108D) have greater dimensions (e.g., greater than 40 nm) and are completely filled by both the first fill dielectric layer 120 and the second fill dielectric layer 122. For the trenches with the greater dimensions, the first fill dielectric layer is conformal to the trenches. Thus, the trenches with larger dimensions have dual fill dielectric layers while the trenches with smaller dimensions have a single fill dielectric layer. In some examples, the first fill dielectric layer 120 has a thickness ranging between 1 nm and 20 nm. In some examples, the first fill dielectric layer 120 has a thickness ranging between 1 nm and 3 nm.

The fill dielectric layers may chose suitable dielectric materials different from that of the dielectric material layer 112 to achieve etching selectivity at later etching stage. The first and second dielectric materials have different compositions. For examples, the first fill dielectric material layer 120 is a high-k dielectric material, such as hafnium oxide ($H_fO_2$), or zirconium oxide ($Z_rO_2$) while the second dielectric material layer 122 includes carbon-containing dielectric material, such as silicon carbon oxide, silicon carbon oxynitride or silicon carbon nitride. In other embodiments, the first fill dielectric layer 120 may include other suitable dielectric material, such as metal oxide (such as aluminum oxide $Al_2O_3$), or metal nitride (such as aluminum nitride AlN), or a combination thereof. The second fill dielectric layer 122 may include other dielectric layer, such as silicon oxide, silicon oxynitride, silicon carbide nitride, and/or other suitable dielectric materials. In one example, the first fill dielectric layer 120 includes hafnium oxide deposited by ALD, and the second fill dielectric layer 122 includes silicon carbon oxide deposited by FCVD or spin-on deposition. In some examples, the fill fins of smaller widths (such as 118A with width Wd) have substantially the same width as the width Wf of the device fins 106. As described above, fill fins 118 have different dimensions. For examples, the fill fins 118B and 118C have dimensions greater than that of the fill fin 118A.

In the operation 210, the cut trench 114 is filled as well by both the fill dielectric layers 120 and 122, thereby forming another fill fin 118D (also referred to as fin cut feature) in the cut trench 114. The fill fin 118D is extended and oriented in the X direction, which is orthogonal to the direction of the other fill fins (such as 118A, 118B and 188C) and the device fins. Particularly, the fin cut feature 118D has a width different from the widths of the other fill fins 118A-118C since it is defined by a separate patterning process in the operation 208 and is designed for different criteria (such as enough spacing between adjacent fin ends).

Figure 8A:
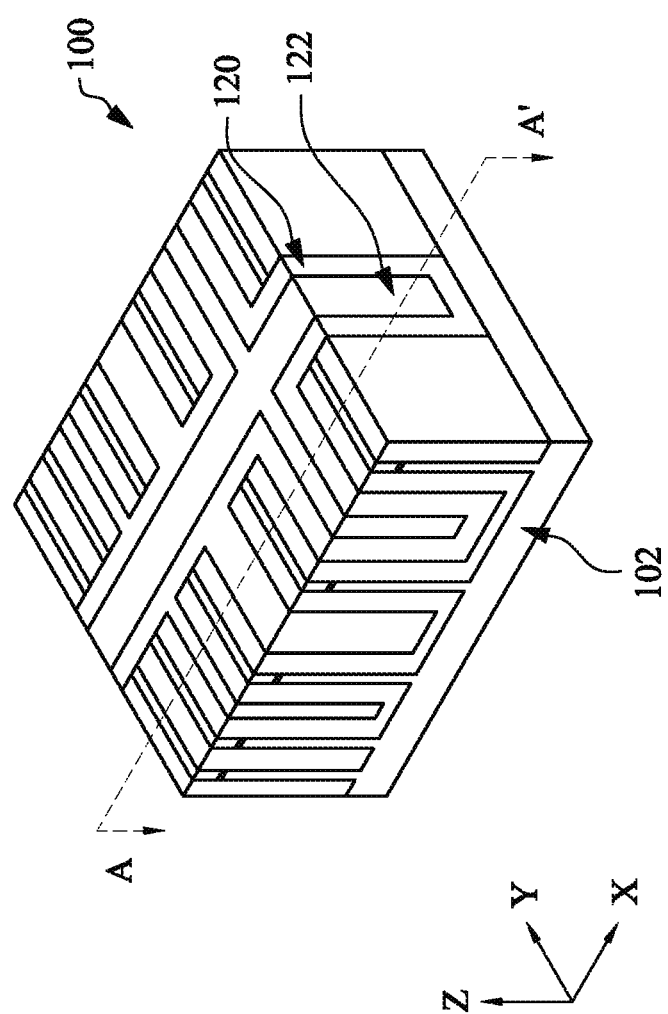
Figure 8C:
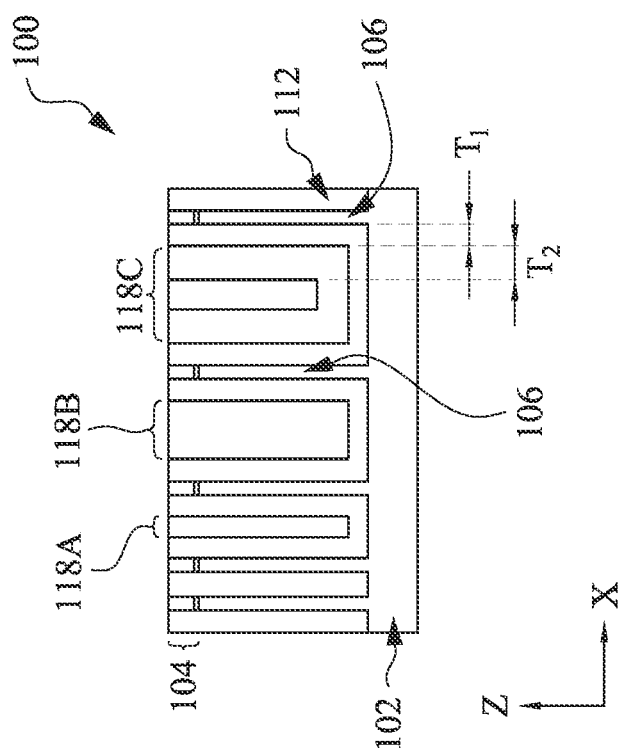
Figure 8B:
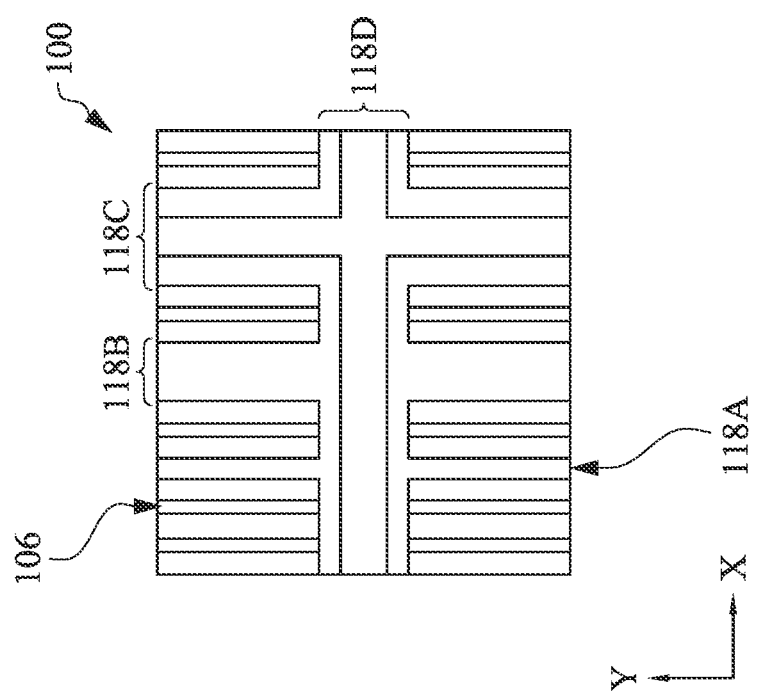

Referring to FIG. 2 and FIGS. 8A-8C, the method 200 proceeds to an operation 212 to perform a polishing such as chemical mechanic polishing (CMP) process to the fill fins 118 to planarize the top surface and remove the excessive portions of the fill dielectric layers 120 and 122 deposited on device fins 106. FIG. 8A is a schematic view of the workpiece 100; FIG. 8B is a top view of the workpiece 100; and FIG. 8C is a sectional view of the workpiece 100 along the dashed line AA'. In some embodiments, the hard mask 102 may function as a CMP stop layer. In some embodiments, the hard mask 102 may be removed by the CMP process or an additional etching process.

When applying only one deposition technique, such as FCVD or spin-on coating, to fill the trenches to form the fill fins, the bottom portions of the fill fins have poor quality, especially for the fill fins with smaller dimensions or greater aspect ratios, which limits the processing window to a smaller range of aspect ratios. In the disclosed method, both the first fill dielectric layer 120 by ALD and the second dielectric layer 122 by FCVD are implemented to fill the trenches and to form the fill fins. As described above, the trenches 108B, 108C and 108D are all completely filled by the disclosed method. By implementing the bi-layer fill fins and the corresponding method to fill the trenches among the device fins, it is achieved to fill all trenches with relative aspect ratio reduced to a smaller range, therefore increasing the processing windows, the circuit performance and the manufacturing capability. Here the aspect ratio of a trench is defined as the depth (D) over width (W) of the trench, as formulated as AS=D/W. The follow descriptions will take the above three fill fins 118A, 118B and 118C (corresponding to trenches 108B, 108C and 108D) as an example. In the present example, the trenches 108B and 108C are completely filled by the first fill dielectric layer 120 while the trench 108D is collectively filled by the dual fill dielectric layers (120 and 122). In the present embodiment, the first fill dielectric layer 120 has a thickness $T_1$ ranging between 12 nm and 25 nm; and the second fill dielectric layer 122 in the trench 108D has a thickness $T_2$ ranging between 16 nm and 360 nm, as illustrated in FIG. 8C. Furthermore, the thickness ratio $T_2/T_1$ of the dual fill dielectric layers in the trench 118D is greater than 1.1. In some examples, the thickness ratio $T_2/T_1$ ranges between 1.2 and 15.

If only the second dielectric layer 122 (by FCVD or spin-on coating) is used to fill those trenches and to form the corresponding fill fins, the method is capable of completely filling the trench 108B, or other trenches with aspect ratios less than that of the trench 108B. By using the dual fill dielectric layers to form the fill fins, the trenches 108 to be collectively filled by the dual fill dielectric layers after deposition of the first fill dielectric layer 120 have aspect ratios reduced to a smaller range. Accordingly, when the second fill dielectric layer 122 is filled to those trenches, such as 108D, the aspect ratios of the corresponding trenches are reduced to less ones, and the second fill dielectric layer 122 is easily filled in with high quality. In one example for illustration, the aspect ratio of the trenches for the second fill dielectric layer 122 is reduced from about 15 to about 9.3. Therefore, when the disclosed bi-layer fill fins and the corresponding method are implemented, the aspect ratio requirement is substantially relaxed; the processing window is enlarged; and the manufacturing capability is enhanced.

Figure 9A:
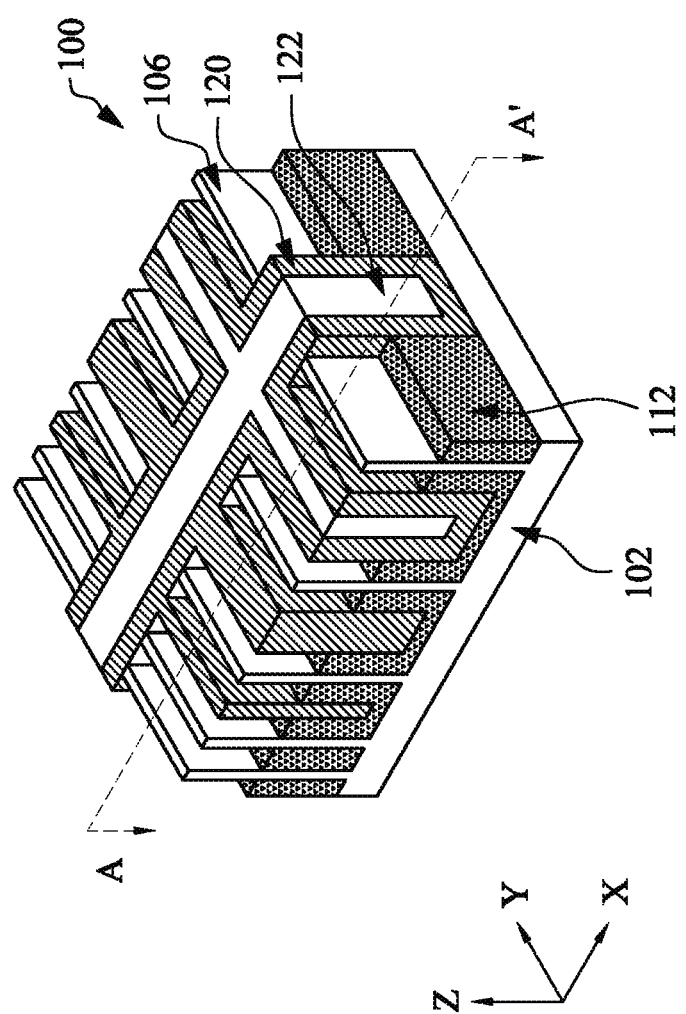
Figure 9C:
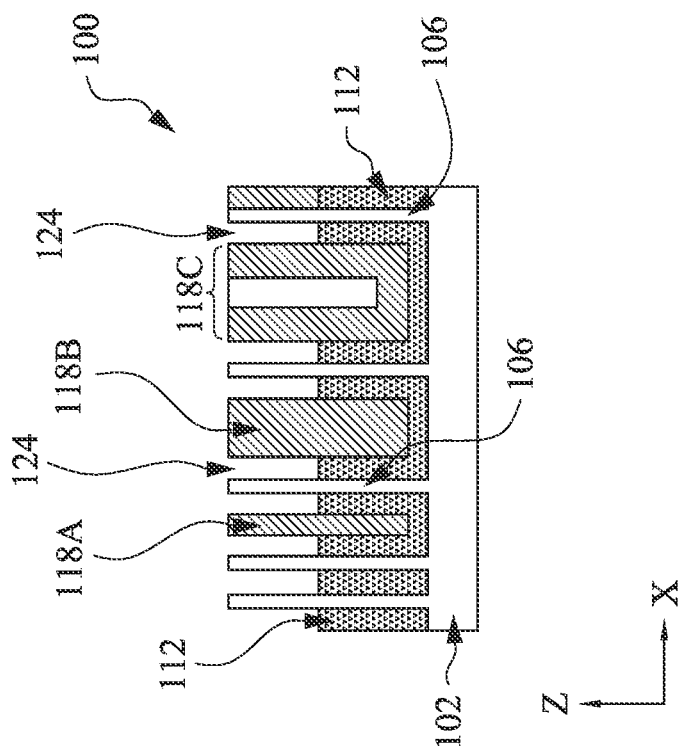
Figure 9B:
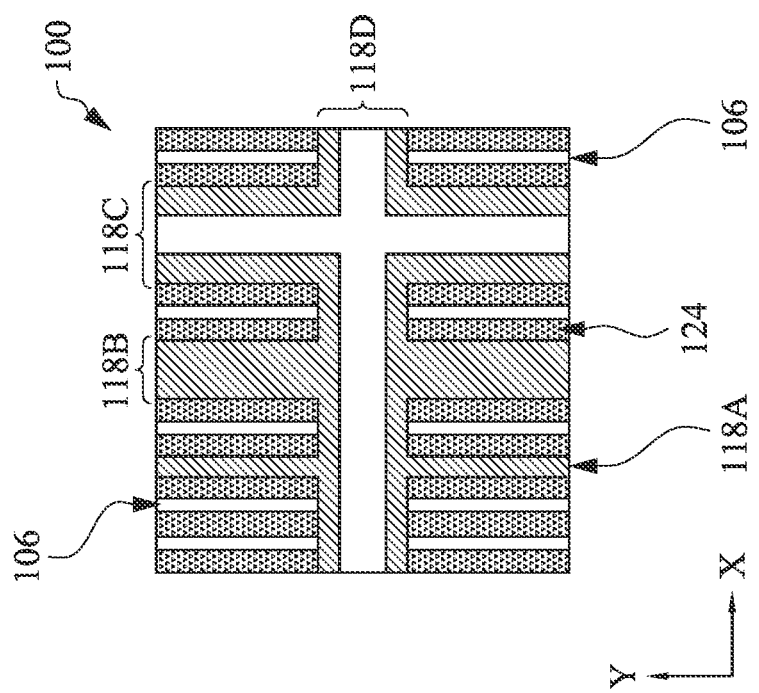

Referring to FIG. 2 and FIGS. 9A-9C, the method 200 proceeds to an operation 214 by selectively recessing the dielectric layer 112. FIG. 9A is a schematic view of the workpiece 100; FIG. 9B is a top view of the workpiece 100; and FIG. 9C is a sectional view of the workpiece 100 along the dashed line AA'. After the dielectric layer 112 is recessed, the fin structure 106 and fill fins 118 are extruded above the recessed dielectric layer 112, with trenches 124 defined between the device fins 106 and the fill fins 118. The device fins 106 are electrically isolated from each other by the recessed dielectric layer 112, which functions as isolation features. Any suitable etching technique may be used to recess the dielectric layer 112, including dry etching, wet etching, RIE, and/or other etching methods. In an exemplary embodiment, an anisotropic dry etching is used to selectively remove the dielectric layer 112 without etching the fin structure 106, with a proper etching gas, such as fluorine-containing or chlorine-containing gas. The height of the device fins 106 are determined by the etching depth of the etching process used to recess the dielectric layer 112.

Figure 10A:
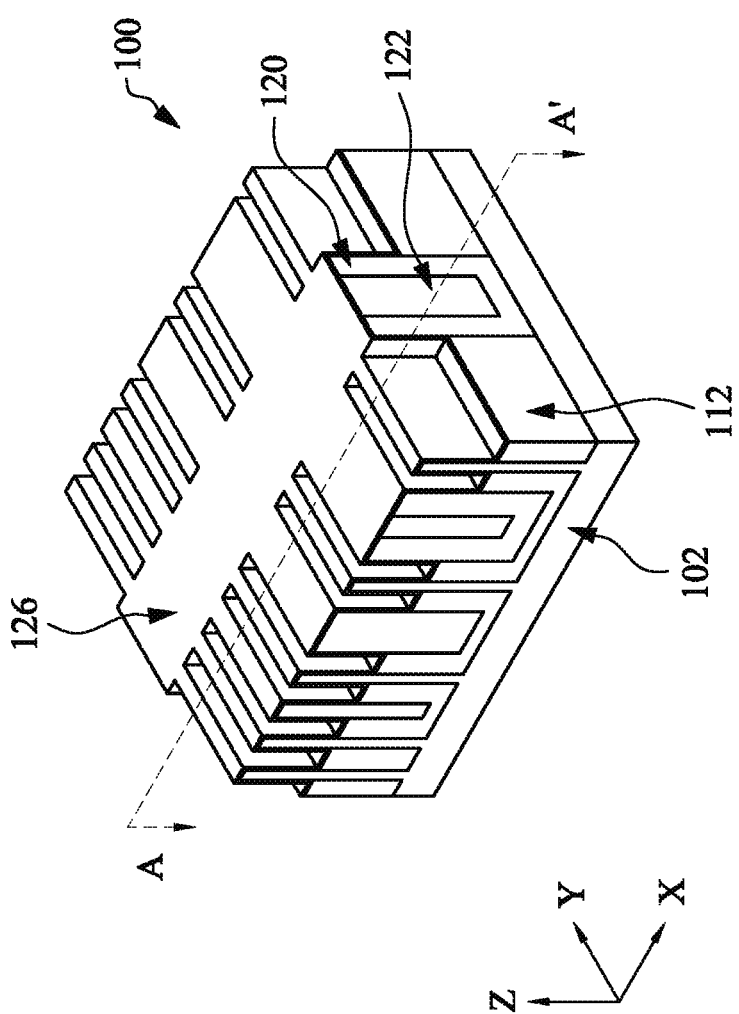
Figure 10C:
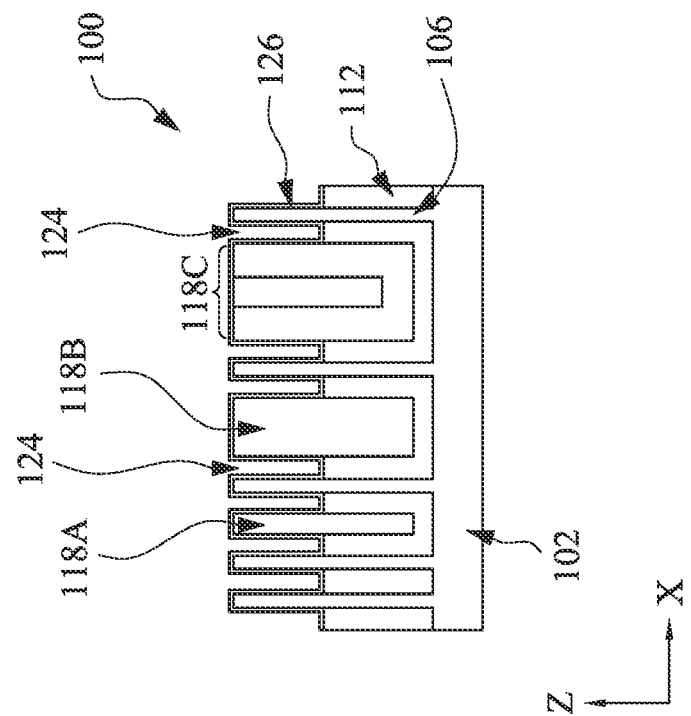
Figure 10B:
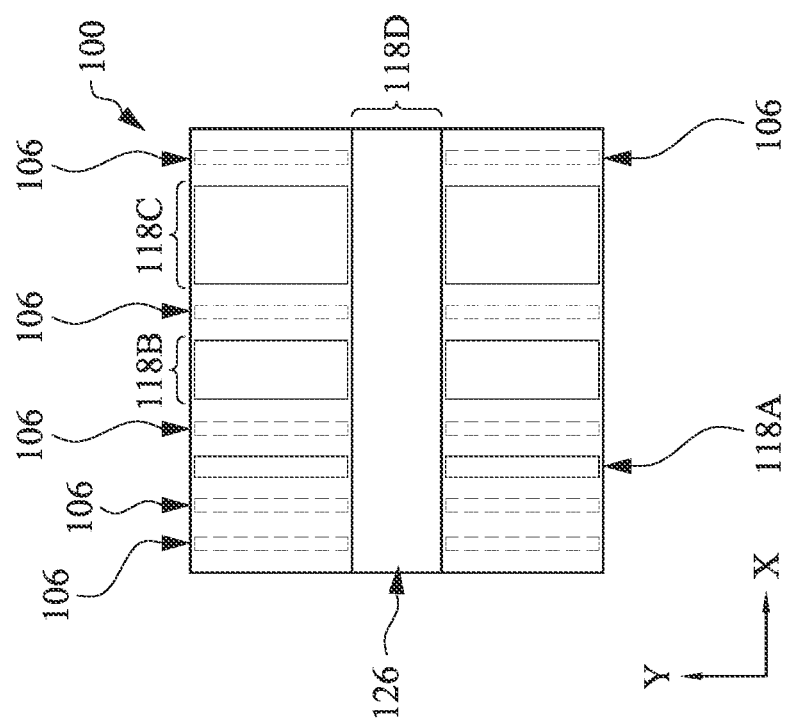

Referring to FIG. 2 and FIGS. 10A-10C, the method 200 may proceed to an operation 216 by forming a dielectric layer 126 on the device fins 106 and the fill fins 118. FIG. 10A is a schematic view of the workpiece 100; FIG. 10B is a top view of the workpiece 100; and FIG. 10C is a sectional view of the workpiece 100 along the dashed line AA'. The dielectric material layer 216 may be formed on the fin structure 106 within the I/O device region and serves as the gate dielectric layer for the I/O FinFETs, or as a part of the gate dielectric layer of the I/O FinFETs so that the I/O FinFETs have a thicker gate dielectric layer for robust performance due to more harsh power surge on the I/O devices. In some embodiments, the dielectric layer 216 includes silicon oxide deposited by a suitable method, such as ALD, CVD, thermal oxidation, ozone oxidation, etc. The formation of the dielectric layer 126 may further include a subsequent annealing process to improve the material quality, such as increasing the material density and reducing the defects. In the present embodiment, the dielectric material layer is deposited on the fin structure in both core device region and I/O device region, and is subsequently removed from the core device region after dummy gates are removed. Furthermore, the dielectric layer 126 is a conformal layer to the profile of the device fins 106 and the fill fins 118. In the top view of the workpiece 100, the dielectric layer 126 covers the device fins 106 and the fill fins 118. For illustrative purpose, those device fins 106 and fill fins 118 are outlined in FIG. 10B, with dashed lines and solid lines, respectively.

Figure 11A:
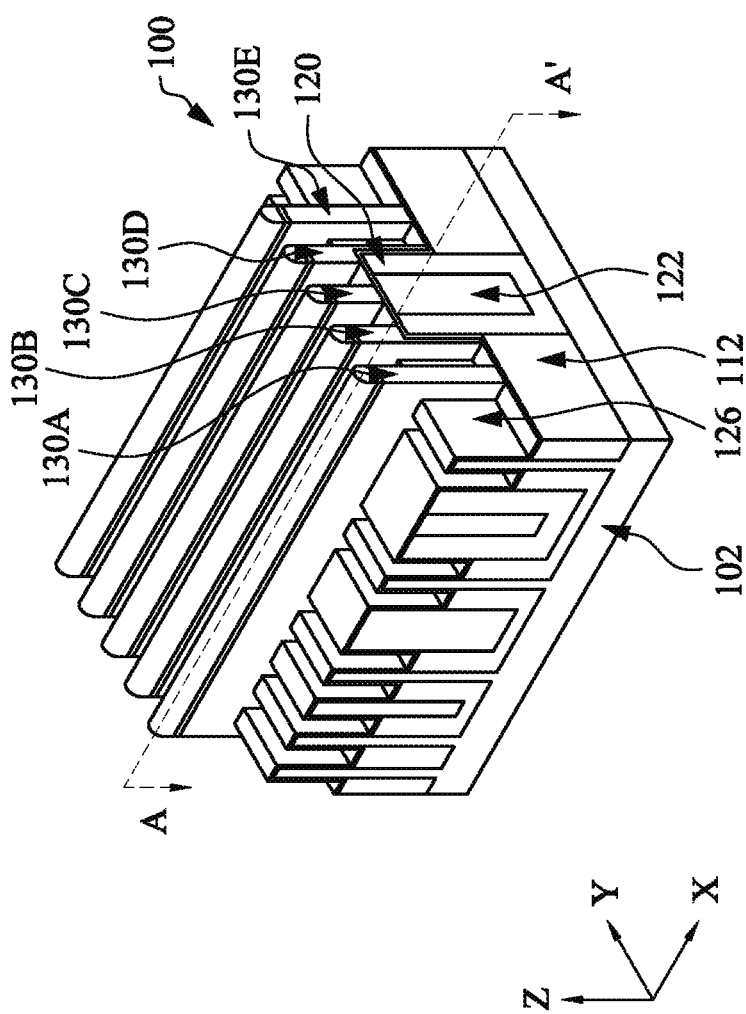
Figure 11C:
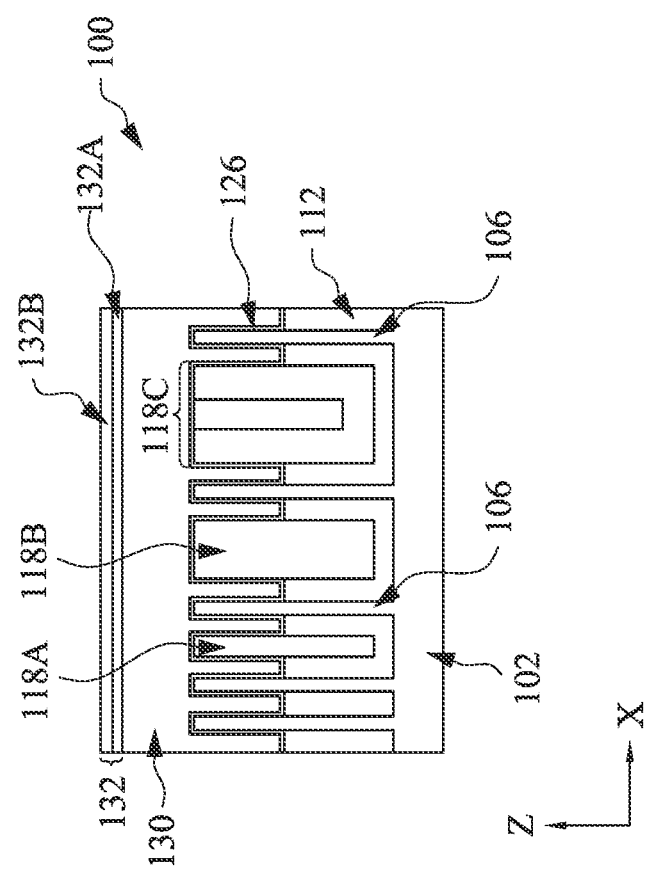
Figure 11B:
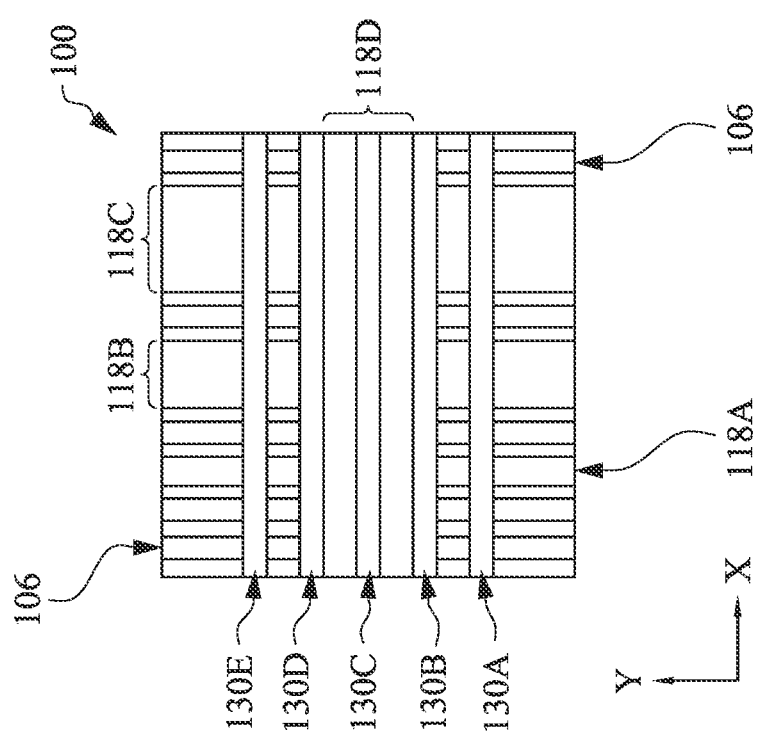

Referring to FIG. 2 and FIGS. 11A-11C, the method 200 proceeds to an operation 218 by forming gate stacks 130, such as exemplary gate stacks 130A-130E. FIG. 11A is a schematic view of the workpiece 100; FIG. 11B is a top view of the workpiece 100; and FIG. 11C is a sectional view of the workpiece 100 along the dashed line AA'. In the present embodiment, the gate stacks 130 will be replaced by metal gate stacks at later fabrication stage, therefore also be referred to as dummy gate stacks. The dummy gate stacks 130 are formed over the channel regions of the device fins 106. In some examples, the formation of the dummy gate stacks 130 includes depositing a dummy gate layer containing polysilicon or other suitable material and patterning the layer. A gate hard mask layer 132 may be formed on the dummy gate material layer and is used as an etch mask during the patterning the dummy gate layer. The gate hard mask layer 132 may include any suitable material, such as a silicon oxide, a silicon nitride, a silicon carbide, a silicon oxynitride, other suitable materials, and/or combinations thereof. In one embodiment, the gate hard mask 132 includes dual mask material films 132A and 132B, such as silicon oxide and silicon nitride. In some embodiments, the patterning process to form the dummy gate stacks includes forming a patterned resist layer by lithography process; etching the hard mask layer using the patterned resist layer as an etch mask; and etching the dummy gate layer to form the dummy gate stacks using the patterned hard mask layer as an etch mask.

Figure 12A:
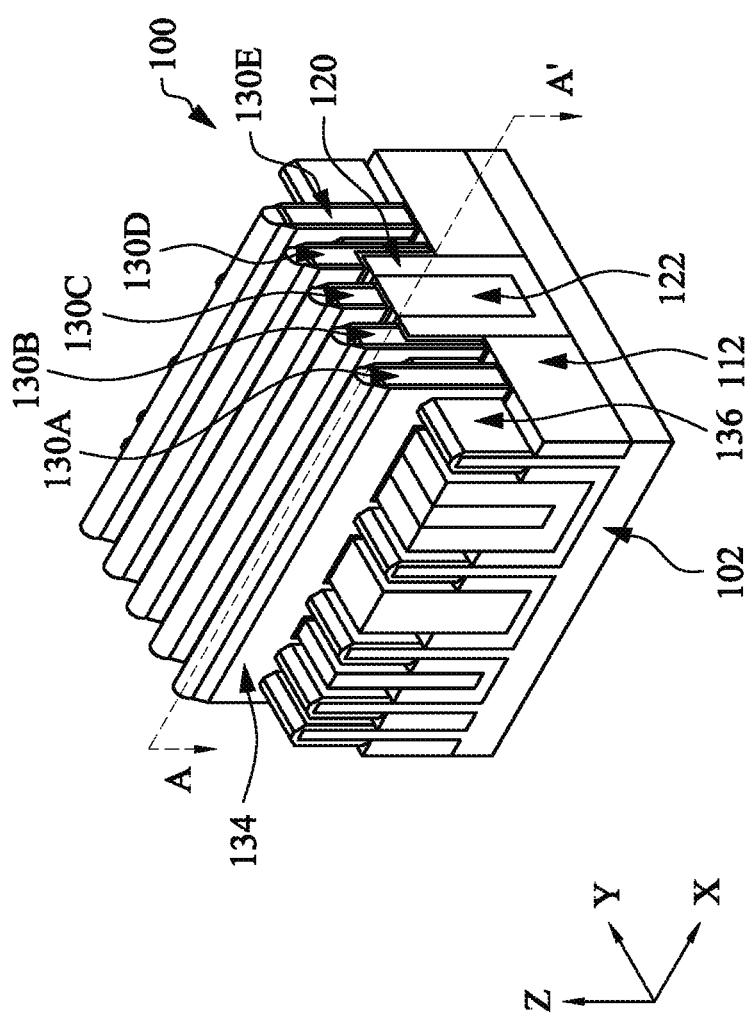
Figure 12C:
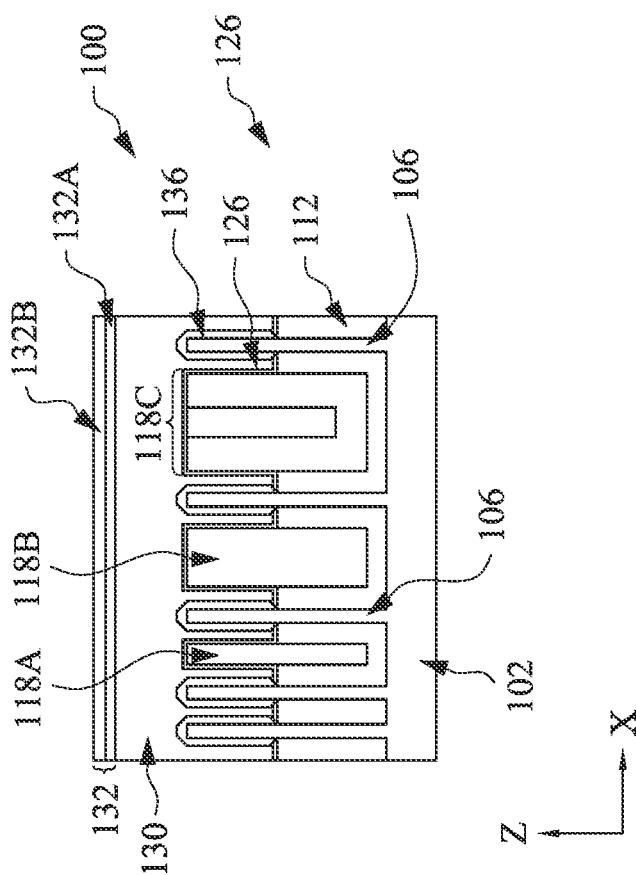
Figure 12B:
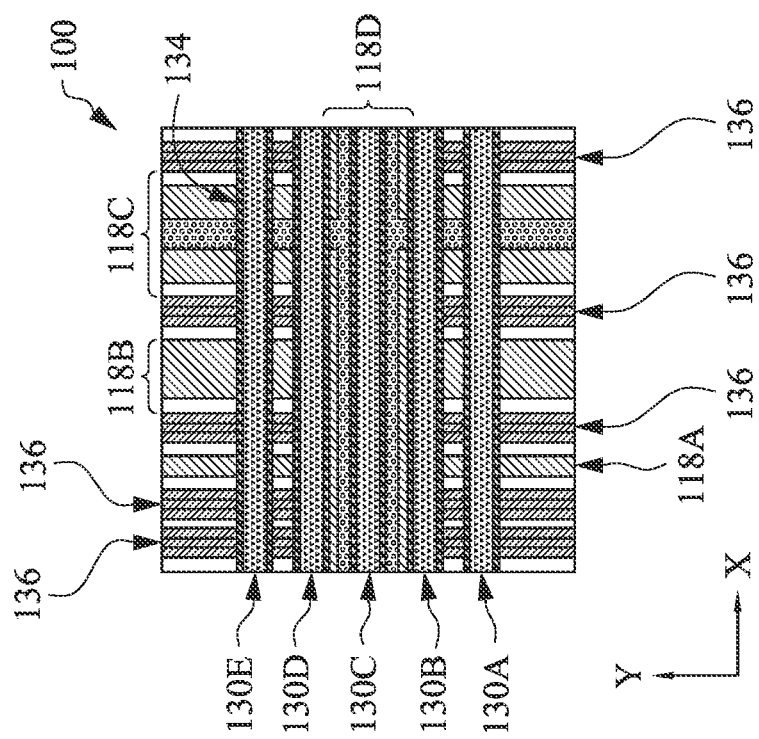

In some embodiments, one or more gate sidewall feature (gate spacer) 134 is formed on the sidewalls of the dummy gate stacks 130, as illustrated in FIGS. 12A-12C. The gate sidewall feature 134 may be used to offset the subsequently formed source/drain features and may be used for designing or modifying the source/drain profile. The gate sidewall feature 134 may include any suitable dielectric material, such as a semiconductor oxide, a semiconductor nitride, a semiconductor carbide, a semiconductor oxynitride, other suitable dielectric materials, and/or combinations thereof. In some embodiments, the gate sidewall feature 134 may include multiple layers, such as a first gate spacer (or a seal layer) on sidewalls of the dummy gate stacks 130 and a second gate spacer on the first gate spacer. In furtherance of the embodiments, the first gate spacer is silicon oxide and the second gate spacer is silicon nitride. In one example, the gate sidewall features are formed by deposition and anisotropic etching, such as dry etching. In another example, the first gate spacer is formed by ALD and the second gate spacer is formed by deposition and anisotropic etching.

Referring to FIG. 2 and FIGS. 12A-12C, the method 200 proceeds to an operation 220 by forming epitaxial source/drain features 136 within the source/drain regions, which are defined in the fin structure and on both sides of the gate stacks 130. FIG. 12A is a schematic view of the workpiece 100; FIG. 12B is a top view of the workpiece 100; and FIG. 12C is a sectional view of the workpiece 100 along the dashed line AA'. The epitaxial source/drain features 136 may be formed by selective epitaxy growth for strain effect with enhanced carrier mobility and device performance. The dummy gate 130 and gate spacer 134 limit and constrain such that the source/drain features 136 are self-aligned in the source/drain regions. In many embodiments, the source/drain features 136 are formed by one or more epitaxial growth (epitaxial process), whereby silicon (Si) features, silicon germanium (SiGe) features, silicon carbide (SiC) features, and/or other suitable semiconductor features are grown in a crystalline state on the fin structure 106 within the source/drain regions. In an alternative embodiment, an etching process is applied to recess portions of the fin structure 106 within the source/drain regions before the epitaxy growth. The etching process may also remove any dielectric material disposed on the source/drain regions, such as during the formation of the gate sidewall features. Suitable epitaxy processes include CVD deposition techniques (e.g., vapor-phase epitaxy (VPE) and/or ultra-high vacuum CVD (UHV-CVD), molecular beam epitaxy, and/or other suitable processes.

The source/drain features 136 may be in-situ doped during the epitaxy process by introducing doping species including: p-type dopants, such as boron or $BF_2$; and n-type dopants, such as phosphorus or arsenic. If the source/drain features 110 are not in-situ doped, an implantation process (i.e., a junction implant process) is performed to introduce the corresponding dopant into the source/drain features 136. In an exemplary embodiment, the source/drain features 136 in an nFET include silicon doped with phosphorous (SiP) or silicon carbide doped with phosphorous (SiCP), while those in a pFET include silicon germanium doped with boron (SiGeB), SiGeSnB (tin may be used to tune the lattice constant) and/or GeSnB. In some other embodiments, the raised source/drain features 136 include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the source/drain features 110. Suitable annealing processes include rapid thermal annealing (RTA), laser annealing processes, other suitable annealing technique or a combination thereof.

Figure 13A:
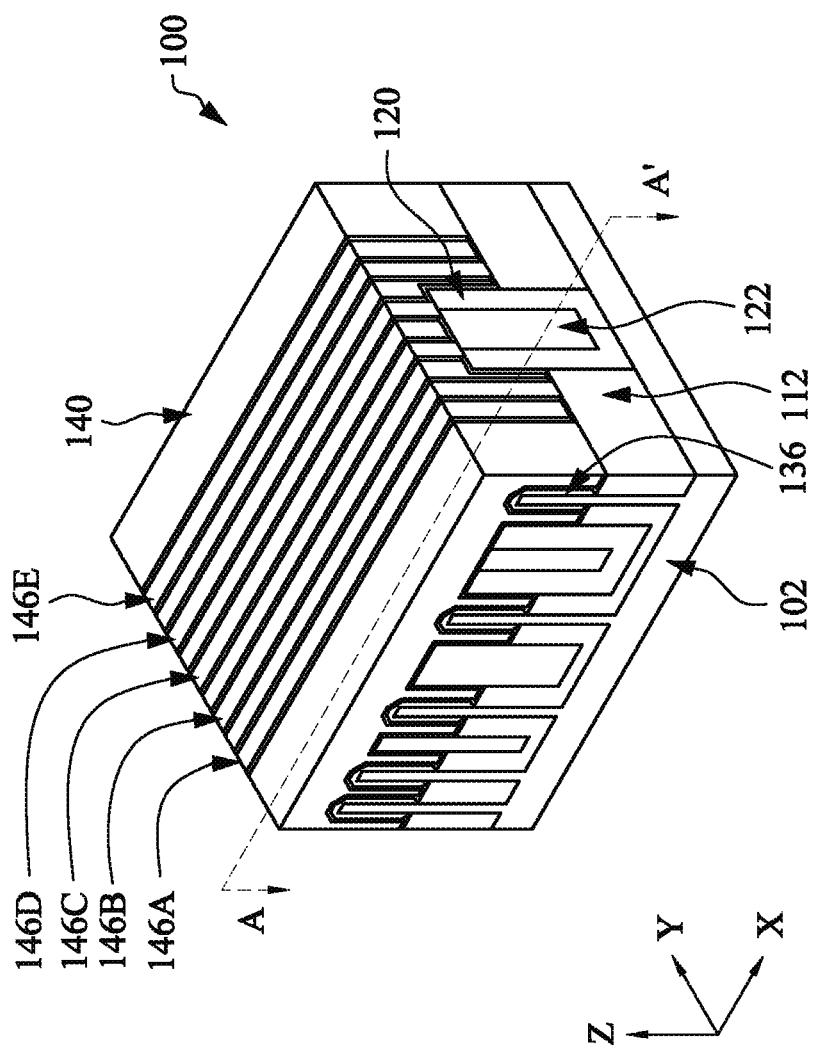
Figure 13C:
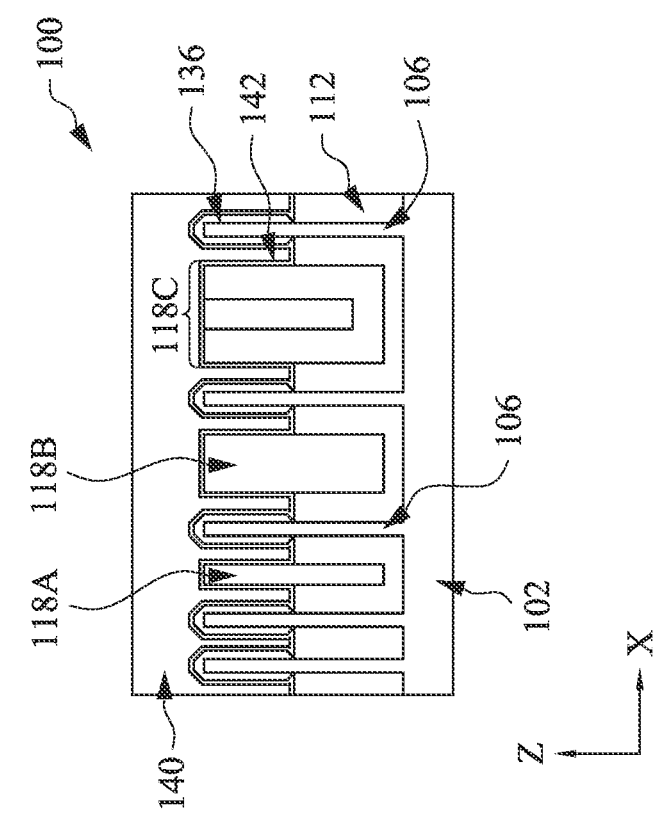
Figure 13B:
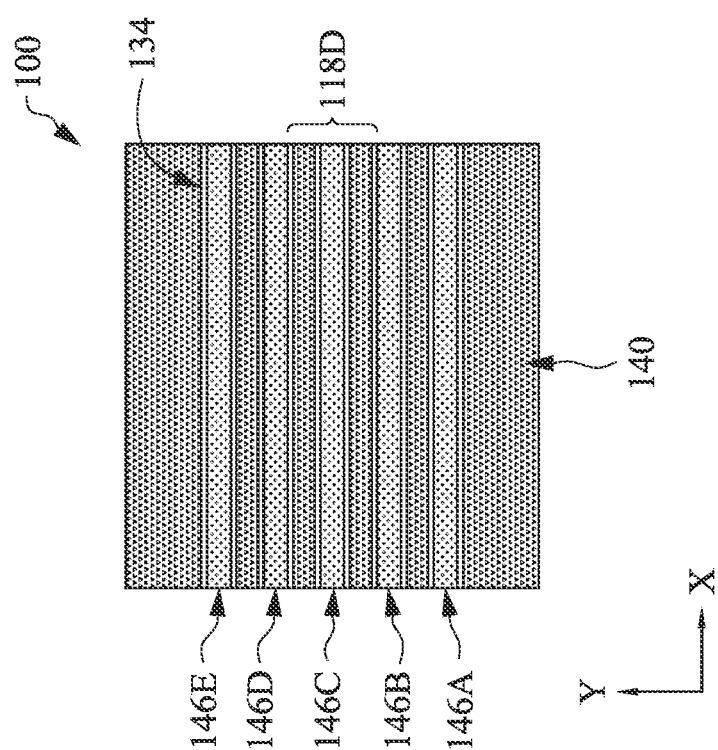

Referring to FIG. 2 and FIGS. 13A-13C, the method 200 proceeds to an operation 222, in which an inter-level dielectric material (ILD) 140 is formed on the substrate to cover the source/drain features 136 in the source/drain regions. FIG. 13A is a schematic view of the workpiece 100; FIG. 13B is a top view of the workpiece 100; and FIG. 13C is a sectional view of the workpiece 100 along the dashed line AA'. The ILD 140 acts as an insulator that supports and isolates conductive traces (such as contacts, vias and metal lines) to be formed therein. The ILD 140 may include any suitable dielectric material, such as a silicon oxide, low-k dielectric material, porous dielectric material, other suitable dielectric material or a combination thereof. In an alternative embodiment, an etch stop layer 142 is deposited on the substrate before the forming of the ILD 140. The etch stop layer 142 functions as etch stopping during the etching to form contacts in the ILD during later fabrication stages. The etch stop layer 142 includes a material different from that of the ILD 140 to provide etch selectivity. For example, the etch stop layer 142 may include silicon nitride deposited by CVD or ALD. In some embodiments, the formation of the ILD 1102 includes deposition and CMP to provide a planarized top surface. The hard mask 132 may be removed during the CMP process, an additional etching operation, or a combination thereof.

Still referring to FIG. 2 and to FIGS. 13A-13C, the method 200 proceeds to an operation 224 to form metal gate stacks 146 (such as metal gate stacks 146A-146E) to replace the dummy gate stacks 130. In the operation 224, the dummy gate stacks 130 are removed by suitable selective etching (such as wet etching), resulting in gate trenches. The etching process may include multiple etching steps to remove the dummy gate if more materials present. After the removal of the dummy gate stacks 130, metal gate materials are deposited in the gate trenches, and a CMP process is applied to remove the excessive gate materials and planarize the top surface.

The gate materials of the metal gate stacks 146 include gate dielectric layer and gate electrode. In some embodiments, the gate dielectric layer includes a high-k dielectric material, and the gate electrode includes metal or metal alloy. The metal gate stacks 146 are formed on the workpiece 100 wrapping around the channel regions of the fin structure 106. In some examples, the gate dielectric layer and the gate electrode each may include a number of sub-layers. The high-k dielectric layer may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The high-k dielectric layer is deposited a suitable technique, such as ALD, CVD, metal-organic CVD (MOCVD), PVD, thermal oxidation, and/or other suitable techniques. The gate dielectric layer may additionally include an interfacial layer disposed between the fin and the high-k dielectric layer. The interfacial layer may include may include silicon oxide, silicon nitride, silicon oxynitride, and/or other suitable material, deposited by a suitable method, such as ALD, CVD, ozone oxidation, etc.

The gate electrode material is then filled in the gate trench. The gate electrode 1604 is formed by ALD, PVD, CVD, plating, other suitable process, or a combination thereof. The gate electrode may include a single layer or multiple layers, such as a metal layer, a liner layer, a wetting layer, and/or an adhesion layer. The gate electrode may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions, such as with a work function of 4.2 eV or less for nFET and a work function of 5.2 eV or greater for pFET. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD. In other examples, a barrier layer may be formed on deposited for lining the gate trenches before filling the metal. The barrier layer may include titanium, titanium nitride, tantalum, tantalum nitride or combination, deposited by suitable technique, such as PVD. In some examples, the gate dielectric layer includes the interfacial layer and the high-k dielectric layer. The gate electrode includes a capping layer, a metal layer to tune the work function, and a filling metal, such as aluminum, copper or tungsten.

Figure 14:
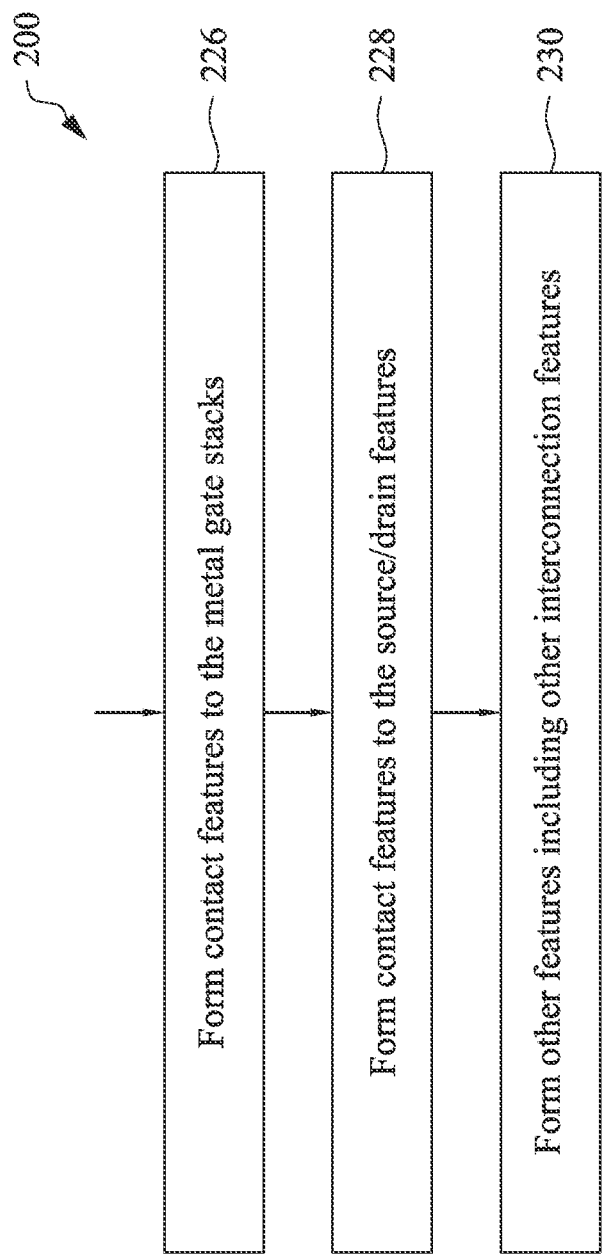
FIG. 14 is a flowchart of an integrated circuit fabrication method in accordance with some embodiments.
Figure 15A:
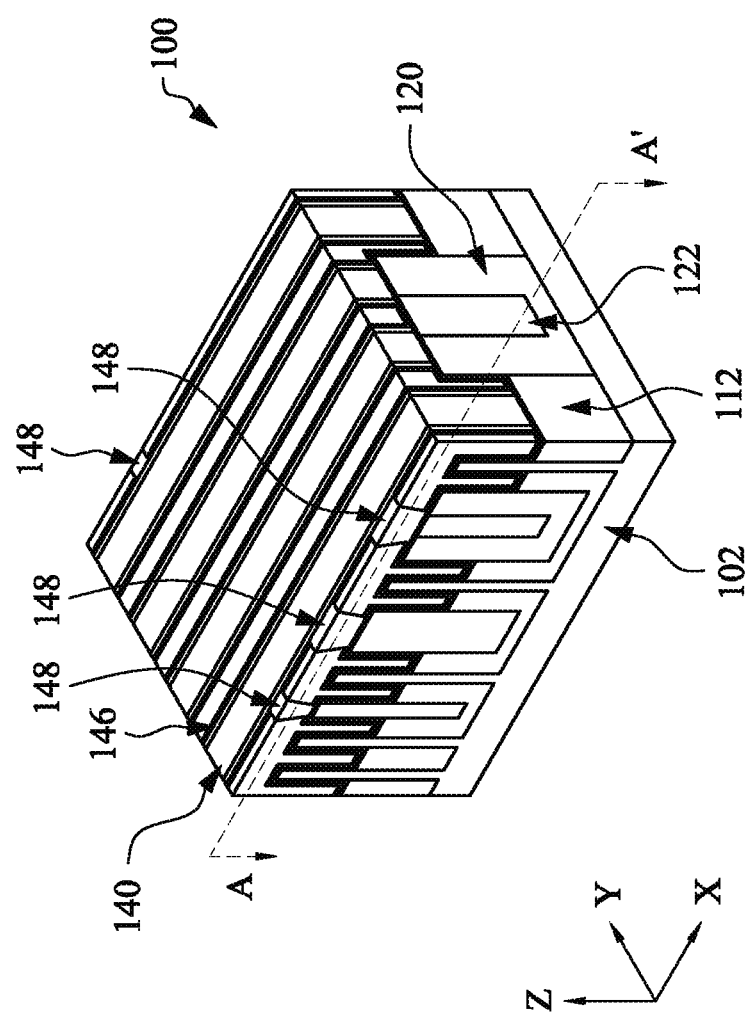

The method 200 may continue to include other operations described in FIG. 14. Referring to FIG. 14 and to FIGS. 15A-15C, the method 200 proceeds to an operation 226 to cut metal gate stacks 146. When the semiconductor technologies advance to higher technology node with smaller features and higher packing densities, the lithography process experiences challenges in its capability and resolution, the patterning of the gate stacks may be achieved by multiple patterning, such as double patterning. For example, the pattern of the gate stacks is decomposed into two patterning procedures, or two sets of lithography process and etching: one forming long gate stacks and another cutting the long gate stacks to shorter according to the design layout. In the present example, the metal gate stacks 146 are patterned and filled with one or more dielectric material to form gate cut features 148. The gate cut features 148 are dielectric features to define the gate ends and the spacing between the gate ends. The formation of the gate cut features 148 may include lithography process, etching and deposition, and may be further followed by CMP. For examples, the formation of the gate cut features includes a lithography process to form a patterned resist layer with openings that define the regions for gate cut features, performing an etching process to selectively etch the gate stacks through the resist openings to form trenches in the gate stacks, depositing one or more dielectric material to fill in the trenches; and performing a CMP process to remove the excessive the dielectric material. The dielectric material of the gate cut features may include silicon oxide, silicon nitride, low-k dielectric material, other suitable dielectric material, or a combination thereof.

Figure 16A:
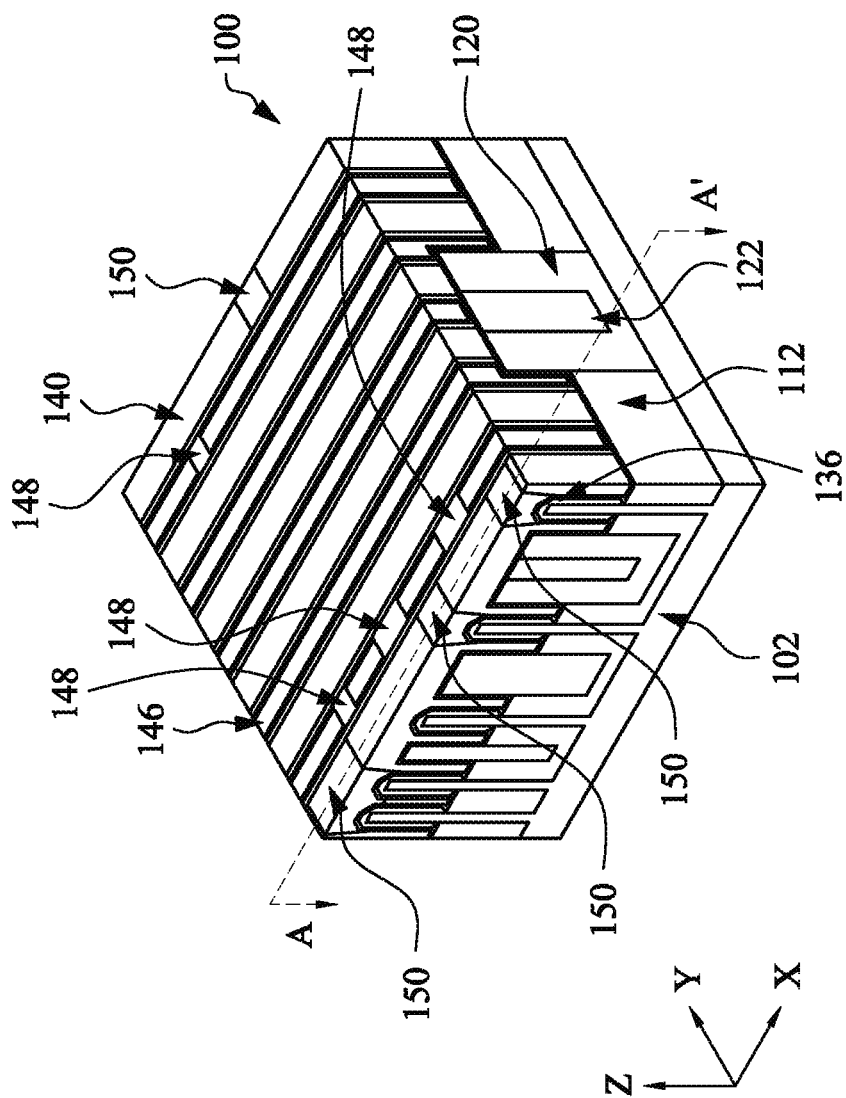
Figure 16C:
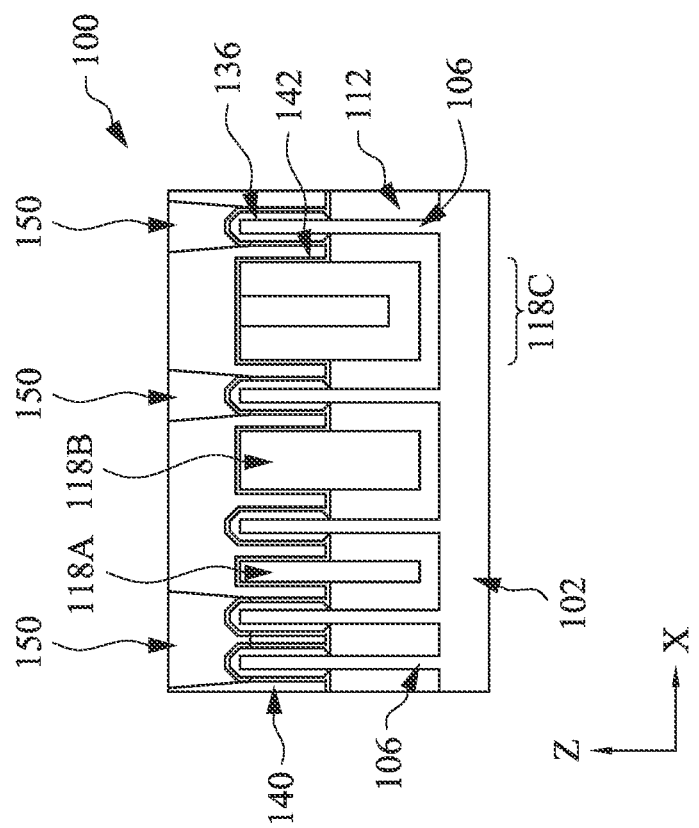
Figure 16B:
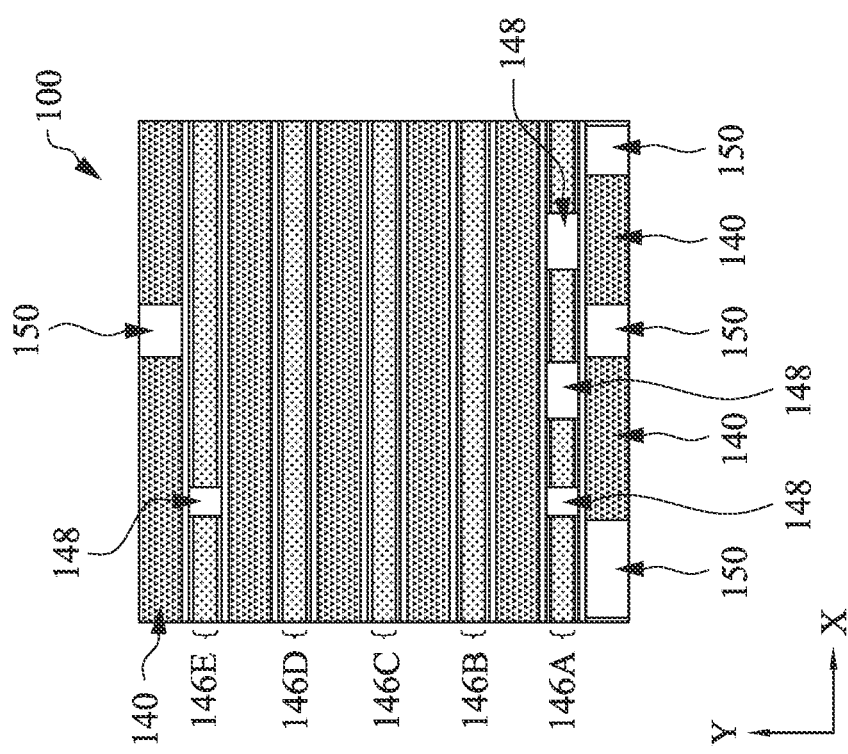

Referring to FIG. 14 and to FIGS. 16A-16C, the method 200 may further include an operation 228 to form contact features 150. The contact features 150 are conductive features to electrically connect the FETs to form a functional circuit. In the present examples, the contact features 150 are designed to land on source/drain features 136. The formation of the contact features 150 may include lithography process, etching and deposition, and may be further followed by CMP. For examples, the formation of the contact features includes a lithography process to form a patterned resist layer with openings that define the regions for contact features, performing an etching process to the ILD 140 through the resist openings to form contact holes in the ILD 140, depositing one or more conductive material to fill in the contact holes; and performing a CMP process to remove the excessive the conductive material. The conductive material of the contact features may include tungsten, copper, aluminum, silicide, other metal or metal alloys, or a combination thereof. The contact features 150 may further include a barrier layer (such as titanium, titanium nitride, tantalum, tantalum nitride or a combination thereof) for lining the contact holes. For example, the contact features 150 include titanium and titanium nitride as a barrier layer deposited by PVD, and tungsten to fill in the contact holes by PVD, plating, other suitable technique or a combination thereof.

The method 200 may further include other operations during, before and/or after the described operations. For example, after the operation 228, the method 200 includes an operation 230 to form other features including other interconnection features. An interconnection structure includes various conductive features to electrically connect various devices (including FETs) to an integrated circuit. The interconnection structure includes contact features, via features and metal lines. The metal lines may be distributed in multiple metal layers and via features vertically connect the metal lines between adjacent metal layers. For example, via features and metal lines may utilize copper technologies and may be formed a damascene process, such as dual damascene process or single damascene process.

The present disclosure provides a method making a semiconductor structure having various FinFETs and the semiconductor structure wherein the FinFETs have bi-layer fill fins. Depending on dimensions, some fill fins with smaller widths only include the first dielectric layer while some other fill fins with greater widths include both the first and second dielectric layers. Particularly, the first dielectric layer is deposited by ALD and the second dielectric layer is deposited using a flow mechanism, such as spin-on coating or FCVD. The fill fins may include some in an orientation parallel with the devices and some in an orthogonal orientation parallel with the gate electrodes. Various advantages may present in different embodiments. Some of the fill fins vary the pattern density of the device fins, therefore enhancing the mechanical strength of the fin structure without collapsing. Some of the fill fins may also serve to cut the gate stacks. Furthermore, the bi-layer fill fins and the corresponding method further provide an approach to fill the trenches (among the device fins) to a reduced range of the aspect ratio, therefore increasing the processing windows, the circuit performance and the manufacturing capability.

Thus, the present disclosure provides a semiconductor structure in accordance with some embodiments. The semiconductor structure includes device fins formed on a substrate; fill fins formed on the substrate and disposed among the device fins; and gate stacks formed on the device fins and the fill fins. The fill fins include a first dielectric material layer and a second dielectric material layer deposited on the first dielectric material layer. The first and second dielectric material layers are different from each other in composition.

The present disclosure provides a method for fabricating an integrated circuit. The method includes forming a device fin structure on a substrate, wherein the device fin structure includes a plurality of device fins and defines trenches among the device fins; filling the trenches with a first dielectric material layer and a second dielectric material layer, resulting in a fill fin structure having a plurality of fill fins; and forming gate stacks on the device fins and the fill fins.

The present disclosure provides a semiconductor structure. The semiconductor structure includes a plurality of device fins formed on a substrate; a plurality of fill fins formed in trenches among the device fins. The fill fins includes a first fill fin having a first width and a second fill fin with a second width greater than the first width. The first fill fin includes a first dielectric material layer. The second fill fin includes the first dielectric material layer and a second dielectric material layer. The semiconductor structure further includes gate stacks formed on the device fins and the fill fins. The first dielectric material layer includes at least one of metal oxide and metal nitride. The second dielectric material layer includes a dielectric layer containing silicon and carbon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a first device fin and a second device fin formed on a substrate;
dielectric fins formed on the substrate, wherein the dielectric fins include a first dielectric fin with a first width and a second dielectric fin with a second width being greater than the first width; and
a gate stack formed on the first and second device fins and the first and second dielectric fins.

2. The semiconductor structure of claim 1, wherein the first and second device fins and the first and second dielectric fins are longitudinally oriented along a first direction and are configured alternatively along a second direction this is orthogonal to the first direction.

3. The semiconductor structure of claim 2, wherein the first and second device fins and the first and second dielectric fins are spaced away from each other along the second direction, defining gaps each spanning between one of the first and second device fins and one of the first and second dielectric fins; and
portions of the gate stack are inserted in the gaps.

4. The semiconductor structure of claim 2, wherein the second dielectric fin includes both a first and second dielectric material layers;
the first dielectric fin includes the first dielectric material layer and is free of the second dielectric material layer; and
the first and second dielectric material layers are different from each other in composition.

5. The semiconductor structure of claim 4, wherein the first dielectric material layer includes a high-k dielectric material; and
the second dielectric material layer includes a carbon-containing material.

6. The semiconductor structure of claim 4, wherein the first dielectric material layer is chosen from a metal oxide, a metal nitride and a combination thereof; and
the second dielectric material layer includes carbon and silicon.

7. The semiconductor structure of claim 6, wherein the first dielectric material layer includes at least one of hafnium oxide ($H_fO_2$), zirconium oxide ($Z_rO_2$), and aluminum oxide ($Al_2O_3$); and
the second dielectric material layer includes one of silicon carbon oxide, silicon carbon oxynitride, and silicon carbon nitride.

8. The semiconductor structure of claim 4, wherein the dielectric fins further include a third dielectric fin having a third width that is greater than the first width and less than the second width; and the third dielectric fin includes the first dielectric material layer and is free of the second dielectric material layer.

9. The semiconductor structure of claim 8, wherein
the gate stack is longitudinally oriented in the second direction;
the first, second and third dielectric fins are oriented in the first direction;
the dielectric fins further include a fourth dielectric fin oriented in the second direction;
the fourth dielectric fin has a fourth width greater than the second width; and
the fourth dielectric fin includes both the first and second dielectric material layers.

10. The semiconductor structure of claim 4, wherein the first dielectric material layer surrounds the second dielectric material layer and contacts sidewall surfaces of the second dielectric material layer in the second dielectric fin.

11. A method for fabricating an integrated circuit, comprising:
forming device fins on a substrate with trenches defined among the device fins;
filling the trenches with a first, a second, and a third dielectric material layers sequentially; and
selectively removing upper portions of the first dielectric material layer, resulting in a first dielectric fin and a second dielectric fin being spaced away from the device fins with gaps defined therein, wherein the first dielectric fin includes a first width and the second dielectric fin includes a second width being greater than the first width.

12. The method of claim 11, further comprising forming a gate stack disposed on the device fins, and the first and second dielectric fins, wherein
the forming device fins on a substrate includes forming a first and second device fins longitudinally oriented along a first direction, defining a first and second trenches;
the first and second device fins and the first and second dielectric fins are alternatively configured and are spaced away from each other along a second direction that is orthogonal to the first direction, defining hybrid gaps each spanning between one of the first and second device fins and one of the first and second dielectric fins; and
the forming a gate stack includes forming portions of the gate stack inserted in the hybrid gaps.

13. The method of claim 12, wherein
the second trench is wider than the first trench; and
the filling the trenches with a first, a second, and a third dielectric material layers sequentially includes completely filling the first trench with the first and second dielectric material layers, and completely filling the second trench with the first, second and third dielectric material layers.

14. The method of claim 13, wherein
the first dielectric fin is free of the third dielectric material layer; and
the second and third dielectric material layers are different from each other in composition.

15. The method of claim 14, wherein the filling the trenches includes
performing an atomic layer deposition (ALD) process to deposit the second dielectric material layer in the trenches to completely fill in the first trench; and
depositing the third dielectric layer on the second dielectric material layer to completely fill in the second trench, using one of spin-on coating and flowable chemical vapor deposition (FCVD) such that the second dielectric material layer surrounds the third dielectric material layer and contacts sidewall surfaces of the third dielectric material layer in the second dielectric fin.

16. The method of claim 11, wherein
the second dielectric material layer includes a high-k dielectric material; and
the third dielectric material layer includes a carbon-containing material.

17. The method of claim 16, wherein
the second dielectric material layer includes at least one of hafnium oxide ($H_fO_2$), zirconium oxide ($Z_rO_2$), and aluminum oxide ($Al_2O_3$); and
the third dielectric material layer includes one of silicon carbon oxide, silicon carbon oxynitride, and silicon carbon nitride.

18. A semiconductor structure, comprising:
a first device fin and a second device fin formed on a substrate;
a first dielectric fin formed on the substrate and disposed between the first and second device fins;
a second dielectric fin formed on the substrate and disposed on a side of the second device fin opposite to the first device fin, wherein the first dielectric fin includes a first width and the second dielectric fin includes a second width greater than the first width; and
a gate stack disposed on the first and second device fins and the first and second dielectric fins.

19. The semiconductor structure of 18, wherein a first portion of the gate stack is inserted in a first gap between the first device fin and the first dielectric fin, and a second portion of the gate stack is inserted in a second gap between the second device fin and the first dielectric fin.

20. The semiconductor structure of claim 19, wherein
the first dielectric fin includes a first dielectric material layer and is free of a second dielectric material layer;
the second dielectric fin includes both the first and second dielectric material layers;
the first and second dielectric material layers are different from each other in composition; and
a top surface of the first dielectric material layer and a top surface of the second dielectric material layer in the second dielectric fin are coplanar.

* * * * *